United States Patent
So et al.

(10) Patent No.: US 11,985,757 B2
(45) Date of Patent: May 14, 2024

(54) PRINTED CIRCUIT BOARD ASSEMBLY

(71) Applicant: SAMSUNG ELECTRO-MECHANICS CO., LTD., Suwon-si (KR)

(72) Inventors: Won Wook So, Suwon-si (KR); Doo Il Kim, Suwon-si (KR); Young Sik Hur, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 19 days.

(21) Appl. No.: 17/372,032

(22) Filed: Jul. 9, 2021

(65) Prior Publication Data
US 2021/0337652 A1    Oct. 28, 2021

Related U.S. Application Data

(62) Division of application No. 16/566,217, filed on Sep. 10, 2019, now Pat. No. 11,096,269.

(30) Foreign Application Priority Data

Apr. 29, 2019    (KR) .......................... 10-2019-0049696

(51) Int. Cl.
*H05K 1/00*    (2006.01)
*H01L 21/56*    (2006.01)
(Continued)

(52) U.S. Cl.
CPC ....... *H05K 1/0203* (2013.01); *H01L 23/3128* (2013.01); *H01L 23/5383* (2013.01);
(Continued)

(58) Field of Classification Search
CPC ........ H05K 1/02; H05K 1/024; H05K 1/0243; H05K 1/117; H05K 1/144; H05K 1/145;
(Continued)

(56) References Cited

U.S. PATENT DOCUMENTS 5,386,214 A * 1/1995 Sugawara ............ H01Q 9/0457
343/700 MS
7,151,010 B2 12/2006 Nguyen
(Continued)

FOREIGN PATENT DOCUMENTS

CN    109390314 A    2/2019
CN    109495612 A    3/2019
(Continued)

OTHER PUBLICATIONS

U.S. Notice of Allowance dated May 11, 2021 issued in U.S. Appl. No. 16/566,217.
(Continued)

*Primary Examiner* — Xiaoliang Chen
(74) *Attorney, Agent, or Firm* — Morgan, Lewis & Bockius LLP

(57) ABSTRACT

A printed circuit board assembly includes a first printed circuit board, a second printed circuit board disposed on the first printed circuit board and including an antenna pattern, a third printed circuit board disposed on the first printed circuit board, one or more first electronic components disposed between the first and the second printed circuit board and electrically connected to at least one of the first and the second printed circuit board, one or more second electronic components disposed between the first and the third printed circuit board, and electrically connected to at least one of the first and the third printed circuit board, a first interposer substrate electrically connecting the first printed circuit board and the second printed circuit board to each other, and a second interposer substrate electrically connecting the first printed circuit board and the third printed circuit board to each other.

10 Claims, 22 Drawing Sheets

(51) Int. Cl.
| | |
|---|---|
| *H01L 23/00* | (2006.01) |
| *H01L 23/31* | (2006.01) |
| *H01L 23/36* | (2006.01) |
| *H01L 23/538* | (2006.01) |
| *H01L 23/552* | (2006.01) |
| *H01L 23/66* | (2006.01) |
| *H01Q 1/38* | (2006.01) |
| *H05K 1/02* | (2006.01) |
| *H05K 1/14* | (2006.01) |
| *H05K 1/18* | (2006.01) |
| *H05K 3/00* | (2006.01) |

(52) U.S. Cl.
CPC ...... *H01L 23/5386* (2013.01); *H01L 23/5389* (2013.01); *H01L 23/552* (2013.01); *H01L 23/66* (2013.01); *H01L 24/20* (2013.01); *H01Q 1/38* (2013.01); *H05K 1/0216* (2013.01); *H05K 1/0277* (2013.01); *H05K 1/144* (2013.01); *H05K 1/181* (2013.01); *H01L 2223/6677* (2013.01); *H01L 2224/214* (2013.01); *H05K 2201/10356* (2013.01); *H05K 2201/10378* (2013.01)

(58) Field of Classification Search
CPC ........ H05K 1/148; H05K 1/181; H05K 1/203; H05K 1/216; H05K 1/277; H05K 3/0097; H05K 3/284; H05K 3/4611; H01L 21/56; H01L 21/486; H01L 21/561; H01L 21/565; H01L 21/4803; H01L 23/36; H01L 23/66; H01L 23/552; H01L 23/573; H01L 23/49827; H01L 23/49838; H01L 23/5383; H01L 23/5386; H01L 2223/6677; H01Q 1/38; H01Q 1/245; H01Q 1/526; H01Q 1/2258; H01Q 1/2283
USPC ........... 361/749, 679.4, 795; 257/749, 679.4, 257/795, 414, 531, 659, 773; 343/701, 343/700 MS, 846
See application file for complete search history.

(56) References Cited

U.S. PATENT DOCUMENTS

| | | | |
|---|---|---|---|
| 7,217,994 B2 | 5/2007 | Zhu | |
| 8,025,237 B2* | 9/2011 | Ochi | H01Q 7/00 |
| | | | 235/492 |
| 8,710,634 B2 | 4/2014 | Chi | |
| 8,829,667 B2 | 9/2014 | Park et al. | |
| 8,907,848 B2* | 12/2014 | Tajima | H01Q 1/48 |
| | | | 343/846 |
| 9,831,564 B1* | 11/2017 | Xie | H01Q 1/2283 |
| 9,941,226 B2 | 4/2018 | Tsai et al. | |
| 9,991,190 B2 | 6/2018 | Huang | |
| 10,121,722 B1 | 11/2018 | Jha | |
| 10,356,903 B1* | 7/2019 | Chen | H01L 25/117 |
| 10,535,597 B2* | 1/2020 | Chen | H01L 21/4803 |
| 10,602,612 B1* | 3/2020 | Hoang | H05K 3/284 |
| 10,674,607 B2 | 6/2020 | Park et al. | |
| 10,709,018 B2* | 7/2020 | Chen | H05K 1/181 |
| 11,073,872 B2* | 7/2021 | Leopold | H05K 9/0024 |
| 11,296,034 B2* | 4/2022 | Chang | H01L 23/49838 |
| 2003/0230801 A1 | 12/2003 | Jiang | |
| 2004/0042190 A1* | 3/2004 | Eng | H01L 25/0655 |
| | | | 257/E21.705 |
| 2005/0104196 A1 | 5/2005 | Kashiwazaki | |
| 2005/0184381 A1 | 8/2005 | Asahi et al. | |
| 2005/0218518 A1 | 10/2005 | Jiang | |
| 2007/0148996 A1* | 6/2007 | Hildebrand | H01R 24/50 |
| | | | 439/63 |
| 2007/0235850 A1 | 10/2007 | Gerber | |
| 2009/0283889 A1 | 11/2009 | Jang | |
| 2010/0237483 A1 | 9/2010 | Chi | |
| 2010/0244223 A1 | 9/2010 | Cho | |
| 2011/0140268 A1 | 6/2011 | Cheah | |
| 2011/0140283 A1 | 6/2011 | Chandra | |
| 2012/0119388 A1 | 5/2012 | Cho | |
| 2012/0228751 A1 | 9/2012 | Song | |
| 2012/0243195 A1 | 9/2012 | Lim et al. | |
| 2013/0070438 A1 | 3/2013 | Choi | |
| 2013/0075927 A1 | 3/2013 | Chi | |
| 2013/0077222 A1* | 3/2013 | Sleven | G01K 11/265 |
| | | | 361/679.4 |
| 2014/0048906 A1* | 2/2014 | Shim | H01L 21/565 |
| | | | 257/532 |
| 2014/0048913 A1 | 2/2014 | Park | |
| 2014/0048914 A1* | 2/2014 | Lin | H01L 24/19 |
| | | | 257/659 |
| 2014/0070368 A1 | 3/2014 | Oyamada et al. | |
| 2014/0312481 A1 | 10/2014 | Choi | |
| 2014/0367854 A1 | 12/2014 | Zhao | |
| 2015/0115466 A1 | 4/2015 | Kim | |
| 2015/0287672 A1* | 10/2015 | Yazdani | H01L 23/49827 |
| | | | 257/774 |
| 2015/0359098 A1 | 12/2015 | Ock | |
| 2016/0086930 A1* | 3/2016 | Koey | H01L 25/0652 |
| | | | 257/773 |
| 2016/0204073 A1 | 7/2016 | Beak et al. | |
| 2017/0018528 A1* | 1/2017 | Nabekura | H01L 25/117 |
| 2017/0214121 A1* | 7/2017 | Ganchrow | H01Q 1/2258 |
| 2018/0090471 A1 | 3/2018 | Chiu | |
| 2018/0337148 A1 | 11/2018 | Baek et al. | |
| 2019/0006334 A1 | 1/2019 | Gardner | |
| 2019/0043847 A1 | 2/2019 | Lee et al. | |
| 2019/0082536 A1* | 3/2019 | Park | H05K 1/116 |
| 2019/0131241 A1 | 5/2019 | Jeng | |
| 2019/0189564 A1 | 6/2019 | Guzek | |
| 2019/0206807 A1 | 7/2019 | Cho | |
| 2019/0327834 A1* | 10/2019 | Kim | H01Q 1/245 |
| 2019/0363073 A1 | 11/2019 | Hong | |
| 2020/0006235 A1* | 1/2020 | Aleksov | H01L 23/66 |
| 2020/0066621 A1 | 2/2020 | Liu | |
| 2020/0075771 A1 | 3/2020 | Kobrinsky | |
| 2020/0098621 A1 | 3/2020 | Bharath | |
| 2020/0170112 A1* | 5/2020 | Matsumaru | H01L 23/66 |
| 2020/0211927 A1 | 7/2020 | Wan | |
| 2020/0286871 A1 | 9/2020 | Liff | |

FOREIGN PATENT DOCUMENTS

| | | |
|---|---|---|
| JP | 2009-60302 A | 3/2009 |
| KR | 10-2014-0023112 A | 2/2014 |
| KR | 10-1504955 B1 | 3/2015 |
| KR | 10-1798918 B1 | 11/2017 |
| KR | 10-2018-0127144 A | 11/2018 |
| TW | 201637156 A | 10/2016 |

OTHER PUBLICATIONS

U.S. Non-Final Office Action dated Jan. 29, 2021 issued in U.S. Appl. No. 16/566,217.
Taiwanese Office Action dated Dec. 3, 2021 issued in corresponding Taiwanese Patent Application No. 108131990.
Korean Office Action dated Mar. 20, 2023, issued in corresponding Korean Patent Application No. 2019-0049696 (with English translation).
Office Action dated Jan. 29, 2024 issued in the related Chinese Patent Application No. 201911274930.5 with English translation.

* cited by examiner

PRINTED CIRCUIT BOARD ASSEMBLY

CROSS-REFERENCE TO RELATED APPLICATION(S)

This application is a divisional of U.S. patent application Ser. No. 16/566,217, filed on Sep. 10, 2019, which claims benefit of priority to Korean Patent Application No. 10-2019-0049696 filed on Apr. 29, 2019 in the Korean Intellectual Property Office, the disclosures of which are incorporated herein by reference in their entireties.

TECHNICAL FIELD

The present disclosure relates to a printed circuit board assembly.

BACKGROUND

As electronic devices have a greater variety of functions than before, a larger number of electronic components have been amounted on a printed circuit board in an electronic device. An area of a printed circuit board on which electronic components are mounted, however, has been reduced as a high capacity battery is required for an electronic device in accordance with an increase in a variety of functions.

As electronic components are disposed in a narrower space, electromagnetic interference (EMI) may occur between the components, a connection path between the components may be elongated such that it may be difficult to dissipate heat generated from the components.

SUMMARY

An aspect of the present disclosure is to provide a printed circuit board assembly having improved integration density of electronic components and having improved thermal dissipation properties, electromagnetic interference (EMI) shielding properties, and the like.

According to an aspect of the present disclosure, a printed circuit board assembly is provided, the printed circuit board assembly including: a first printed circuit board having a first side and a second side opposing the first side; a second printed circuit board disposed on the first side of the first printed circuit board and including an antenna pattern; a third printed circuit board disposed on the first side of the first printed circuit board and spaced apart from the second printed circuit board; one or more first electronic components disposed between the first printed circuit board and the second printed circuit board and electrically connected to at least one of the first printed circuit board and the second printed circuit board; one or more second electronic components disposed between the first printed circuit board and the third printed circuit board, and electrically connected to at least one of the first printed circuit board and the third printed circuit board; a first interposer substrate disposed around the one or more first electronic components and electrically connecting the first printed circuit board and the second printed circuit board to each other; and a second interposer substrate disposed around the one or more second electronic components and electrically connecting the first printed circuit board and the third printed circuit board to each other.

According to an aspect of the present disclosure, a printed circuit board assembly is provided, the printed circuit board assembly including: a first printed circuit board; a first antenna substrate disposed on one side of the first printed circuit board and including a first antenna pattern; one or more first electronic components disposed between the first printed circuit board and the first antenna substrate, and electrically connected to at least one of the first printed circuit board and the first antenna substrate; a first interposer substrate disposed around the one or more first electronic components and electrically connecting the first printed circuit board and the first antenna substrate to each other; a second antenna substrate spaced apart from the first antenna substrate and including a second antenna pattern; and a third antenna substrate spaced apart from the first antenna substrate and including a third antenna pattern. The second antenna substrate and the third antenna substrate are electrically connected to the first antenna substrate respectively through a first connector and a second connector disposed on at least one surface of an upper surface and a lower surface of the first antenna substrate.

According to an aspect of the present disclosure, a printed circuit board assembly is provided, the printed circuit board assembly including: a first printed circuit board having a first surface and a second surface opposing the first surface; a second printed circuit board disposed on the first surface of the first printed circuit board and including an antenna pattern; a first electronic component disposed on a surface of the second printed circuit board opposing the antenna pattern; a second electronic component disposed on the first surface of the first printed circuit board; and a first interposer substrate disposed around the first and second electronic components and electrically connecting the first printed circuit board and the second printed circuit board to each other. The first printed circuit board, the second electronic component, the first electronic component, and the second printed circuit board are sequentially disposed.

According to an aspect of the present disclosure, a printed circuit board assembly is provided, the printed circuit board assembly including: a first printed circuit board having a first surface and a second surface opposing the first surface; a second printed circuit board disposed on the first surface of the first printed circuit board and including a first antenna pattern; an interconnect structure disposed on a surface of the second printed circuit board opposing the first antenna pattern; a frame having a wiring structure, disposed on the interconnect structure, and having a through-hole; a first electronic component disposed in the through-hole and on the interconnect structure; a second electronic component disposed on the first surface of the first printed circuit board; and a first interposer substrate disposed around the second electronic component. The first printed circuit board, the first interposer substrate, the frame, and the second printed circuit board are sequentially disposed.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, embodiments of the present disclosure will be described as follows with reference to the attached drawings.

Electronic Device

Figure 1:
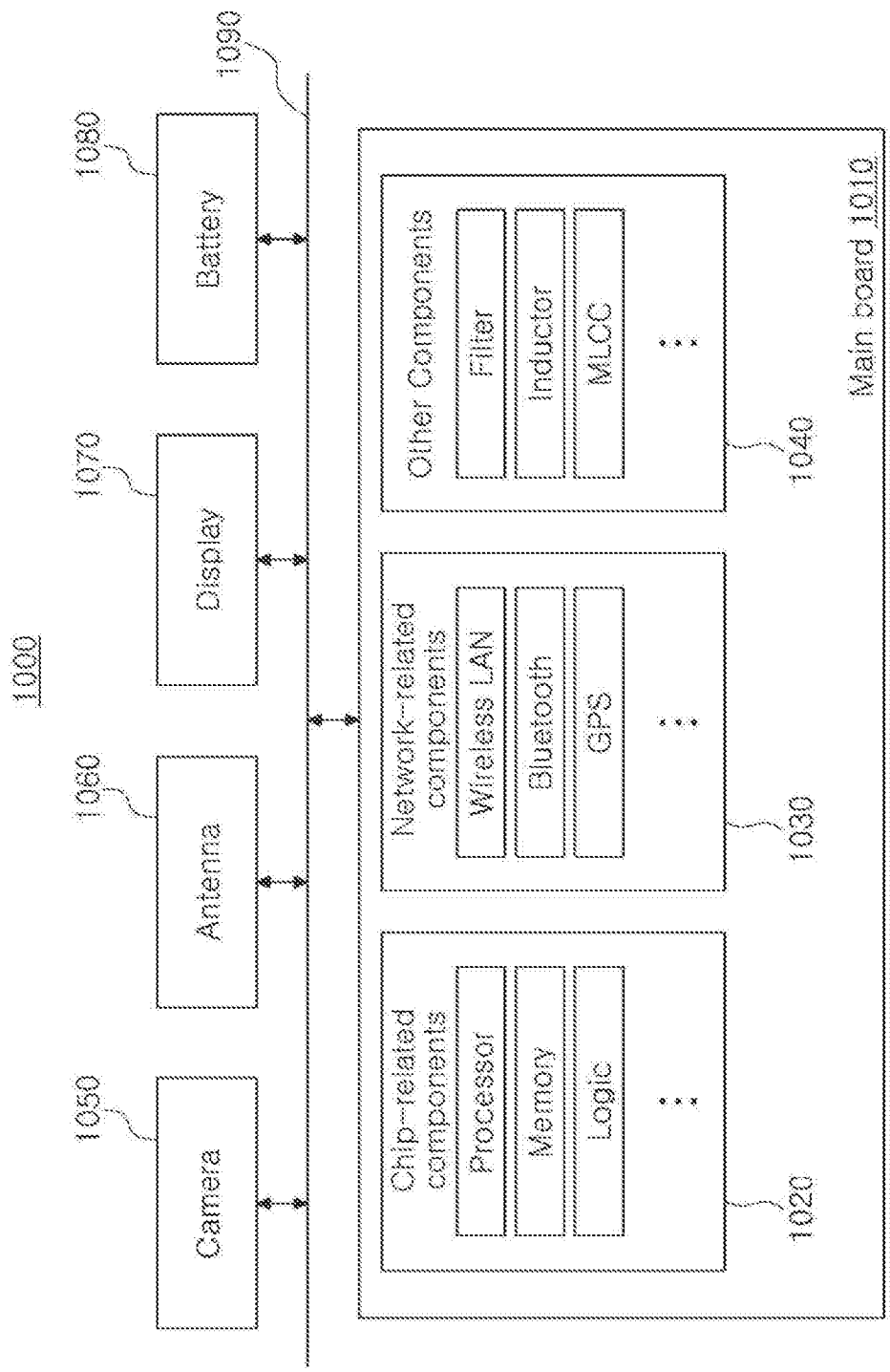
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
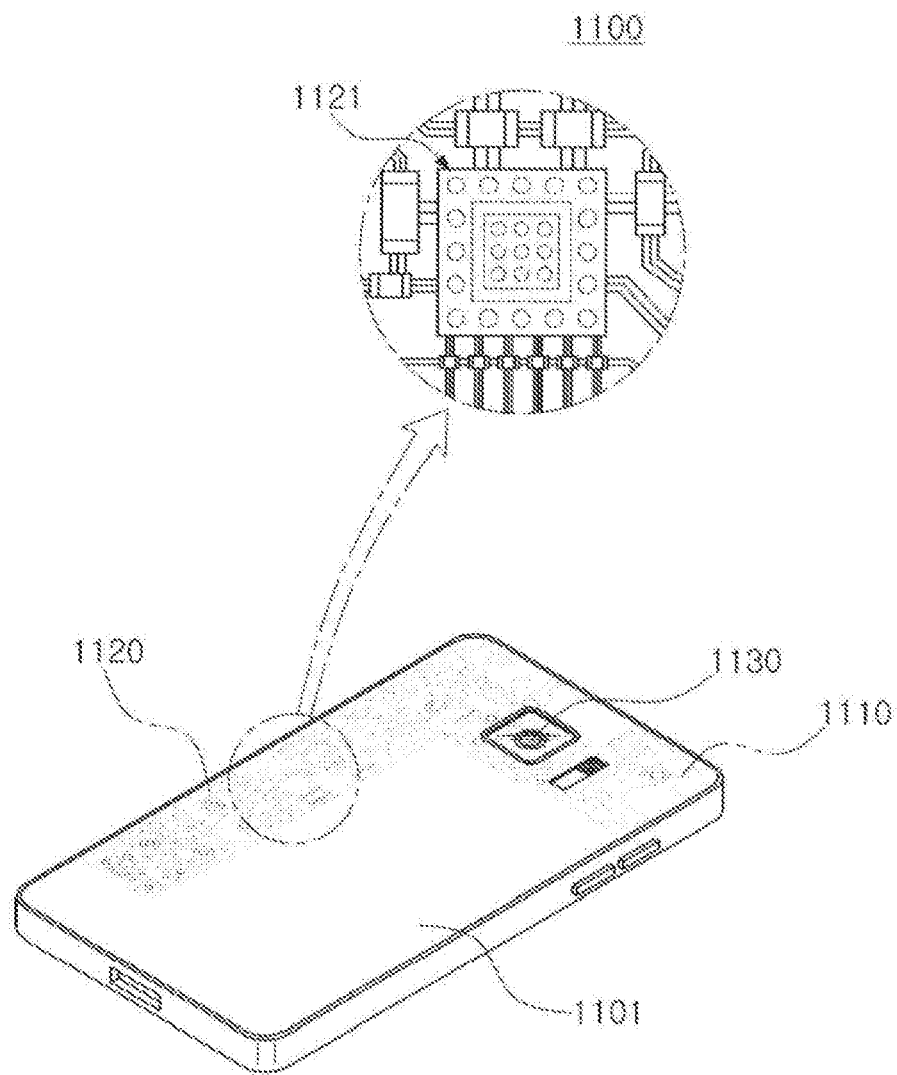
FIG. 2 is a schematic perspective diagram illustrating an example of an electronic device.

FIG. 2 is a schematic perspective diagram illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the motherboard 1110, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will be described in greater detail with reference to the drawings.

Fan-in Semiconductor Package

Figure 3A:
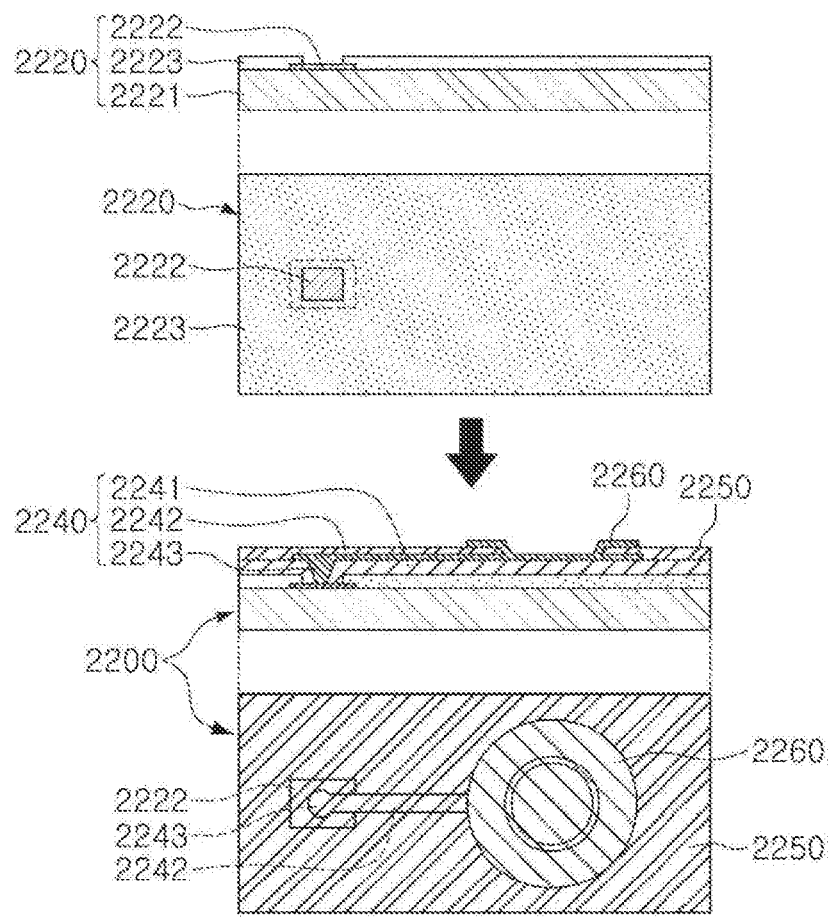
FIGS. 3A and 3B are schematic cross-sectional diagrams illustrating states of a fan-in semiconductor package before and after a packaging process.
Figure 3B:
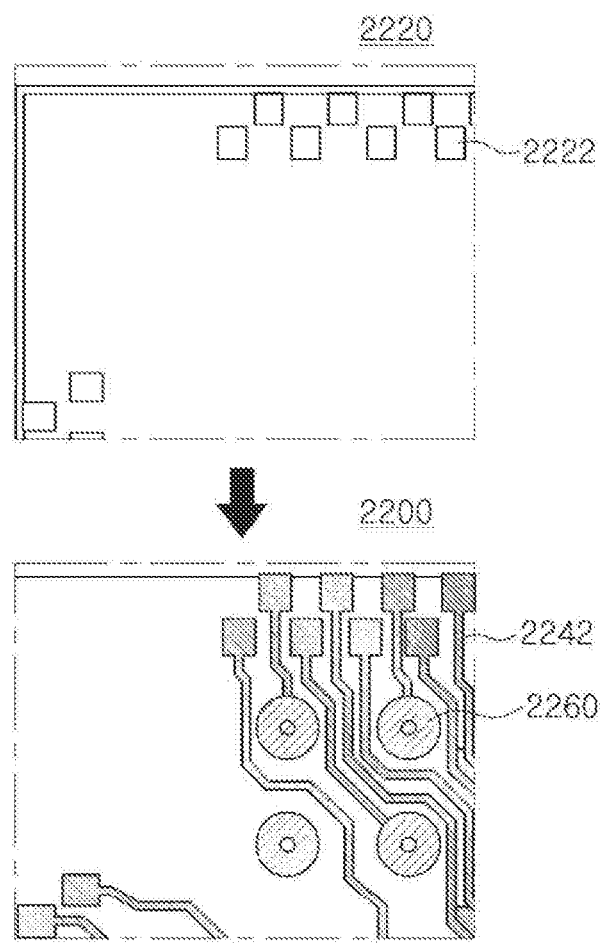

FIGS. 3A and 3B are schematic cross-sectional diagrams illustrating states of a fan-in semiconductor package before and after a packaging process.

Figure 4:
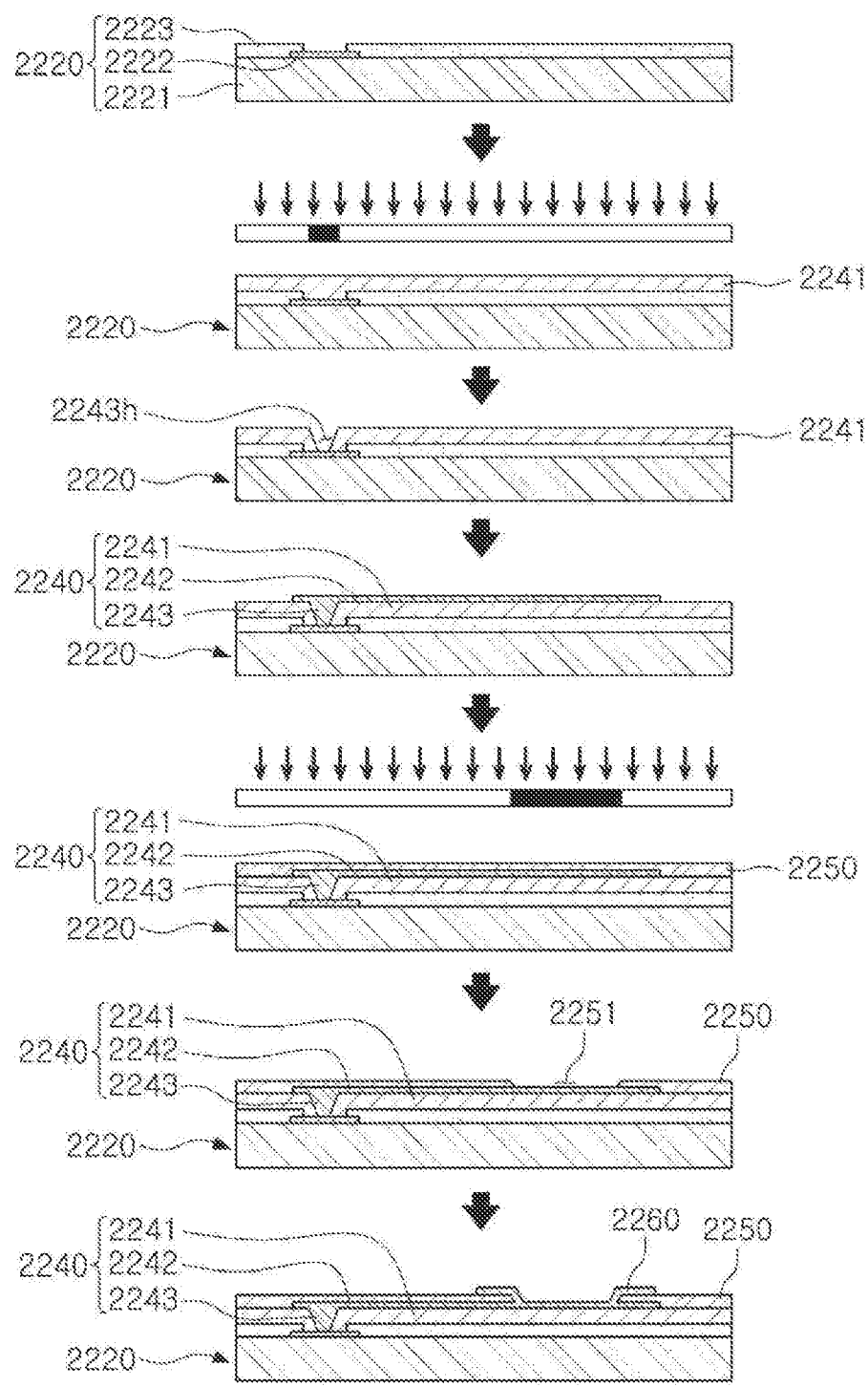
FIG. 4 is a schematic cross-sectional diagram illustrating a process of packaging a fan-in semiconductor package.

FIG. 4 is a schematic cross-sectional diagram illustrating a process of packaging a fan-in semiconductor package.

Referring to FIGS. 3A to 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide layer, a nitride layer, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even though a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip are not enough to directly mount the fan-in semiconductor package on the mainboard of the electronic device.

Figure 5:
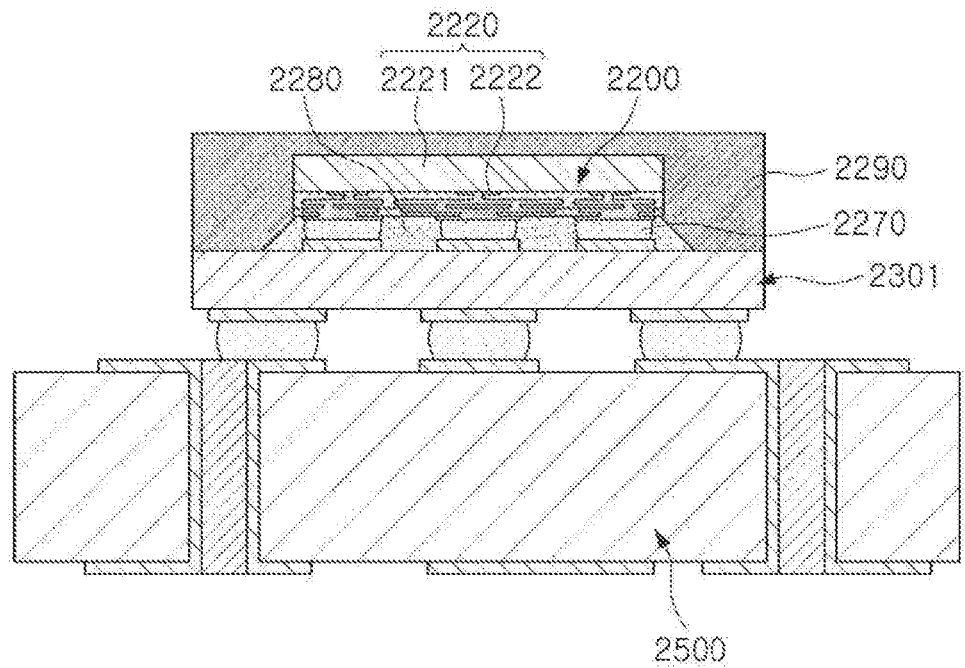
FIG. 5 is a schematic cross-sectional diagram illustrating an example in which a fan-in semiconductor package is mounted on an interposer substrate and mounted on a mainboard of an electronic device.
Figure 6:
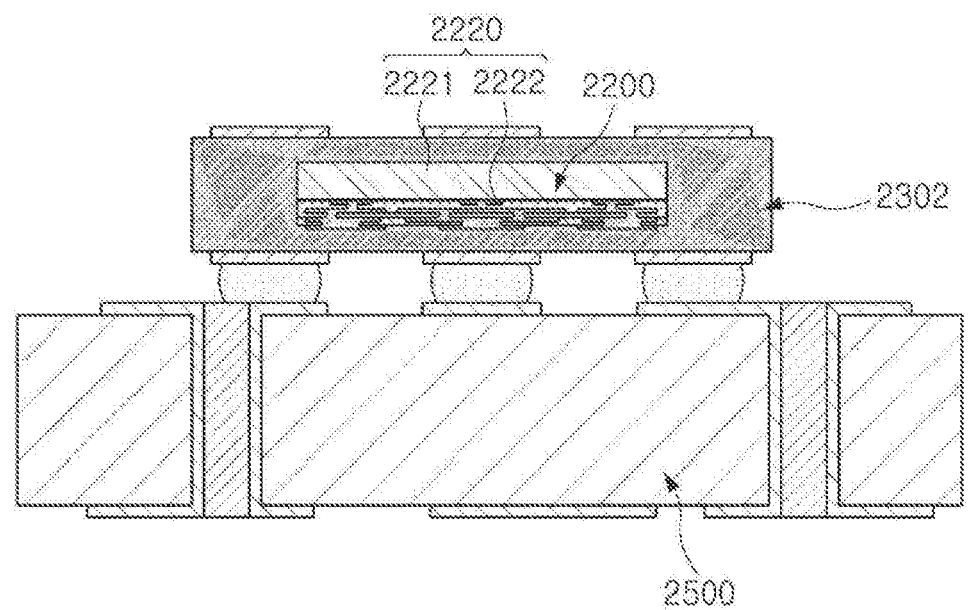
FIG. 6 is a schematic cross-sectional diagram illustrating an example in which a fan-in semiconductor package is embedded in an interposer substrate and mounted on a mainboard of an electronic device.

FIG. 5 is a schematic cross-sectional diagram illustrating an example in which a fan-in semiconductor package is mounted on a ball grid array (BGA) substrate and mounted on a mainboard of an electronic device;

FIG. 6 is a schematic cross-sectional diagram illustrating an example in which a fan-in semiconductor package is embedded in a ball grid array (BGA) substrate and mounted on a mainboard of an electronic device Referring to FIGS. 5 and 6, in a fan-in semiconductor package 2200, connection pads 2222, that is, I/O terminals, of a semiconductor chip 2220 may be redistributed through a BGA substrate 2301, and the fan-in semiconductor package 2200 may be ultimately mounted on a mainboard 2500 of an electronic device in a state in which it is mounted on the BGA substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate BGA substrate 2302, connection pads 2222, that is, I/O terminals, of the semiconductor chip 2220 may be redistributed by the BGA substrate 2302 in a state in which the fan-in semiconductor package 2200 is embedded in the BGA substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate BGA substrate and be then mounted on the mainboard of the electronic device through a packaging process or may be mounted and used on the mainboard of the electronic device in a state in which it is embedded in the BGA substrate.

Fan-Out Semiconductor Package

Figure 7:
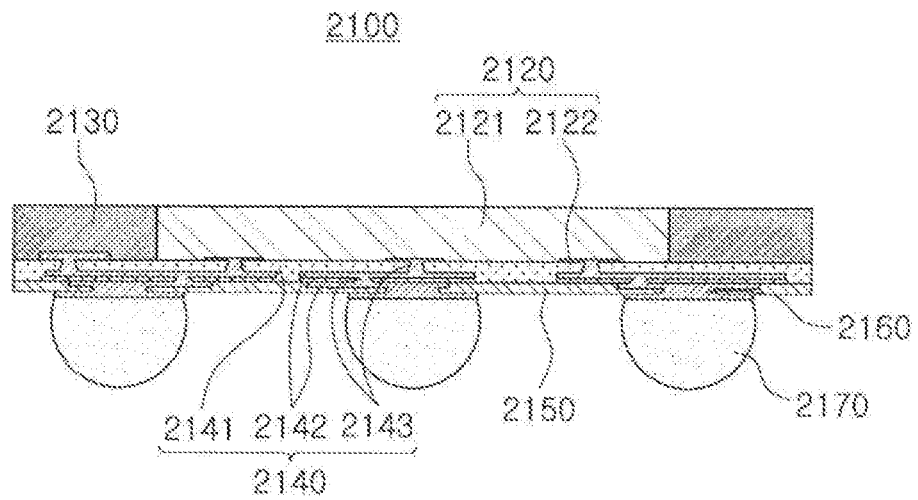
FIG. 7 is a schematic cross-sectional diagram illustrating a fan-out semiconductor package.

FIG. 7 is a schematic cross-sectional diagram illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case in which a size of the semiconductor chip is decreased, a standardized ball layout may be used in the fan-out semiconductor package as it is, such that the fan-out semiconductor package may be mounted on the mainboard of the electronic device without using a separate BGA substrate, as described below.

Figure 8:
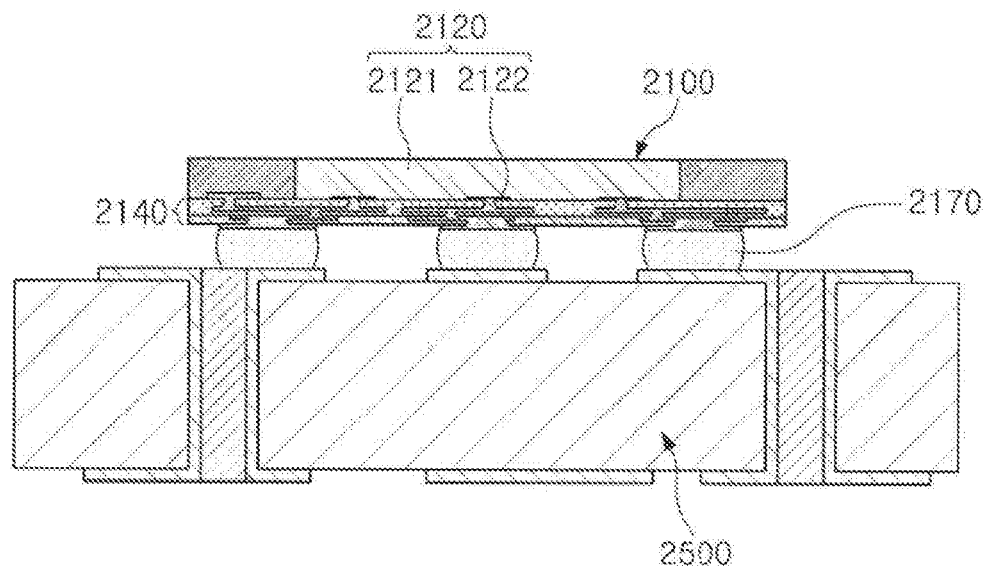
FIG. 8 is a schematic cross-sectional diagram illustrating an example in which a fan-out semiconductor package is mounted on a mainboard of an electronic device.

FIG. 8 is a schematic cross-sectional diagram illustrating an example in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate interposer substrate, or the like.

As described above, since the fan-out semiconductor package may be mounted on the mainboard of the electronic device without using the separate BGA substrate, the fan-out semiconductor package may be implemented at a thickness lower than that of the fan-in semiconductor package using the BGA substrate. Therefore, the fan-out semiconductor package may be miniaturized and thinned. In addition, the fan-out electronic component package has excellent thermal characteristics and electrical characteristics, such that it is particularly appropriate for a mobile product. Therefore, the fan-out electronic component package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as a BGA substrate, or the like, having a scale, a purpose, and the like, different from those of the fan-out semiconductor package, and having the fan-in semiconductor package embedded therein.

Figure 9:
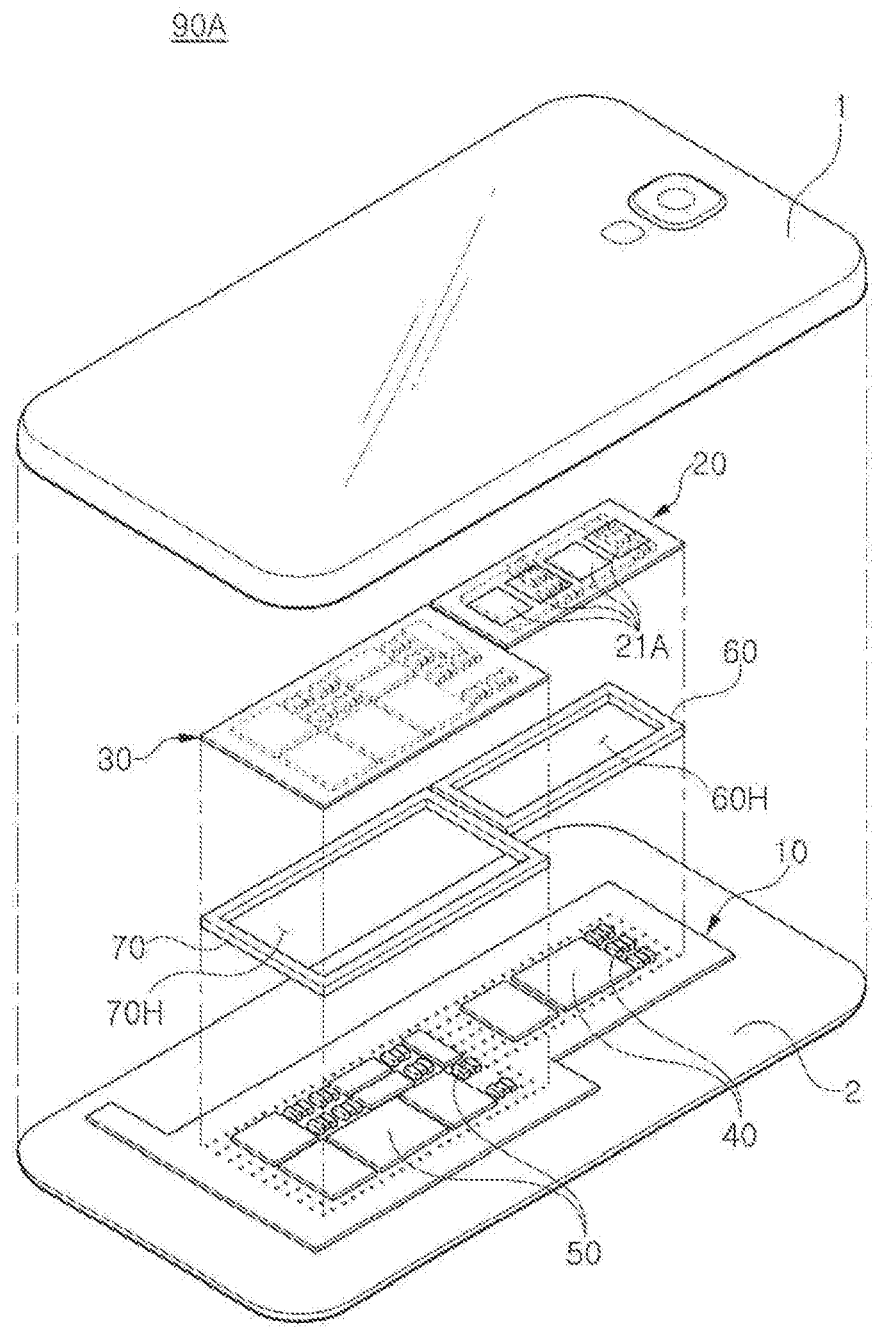
FIG. 9 is a schematic exploded diagram illustrating a printed circuit board assembly in accordance with an example illustrated in FIG. 11.
Figure 11:
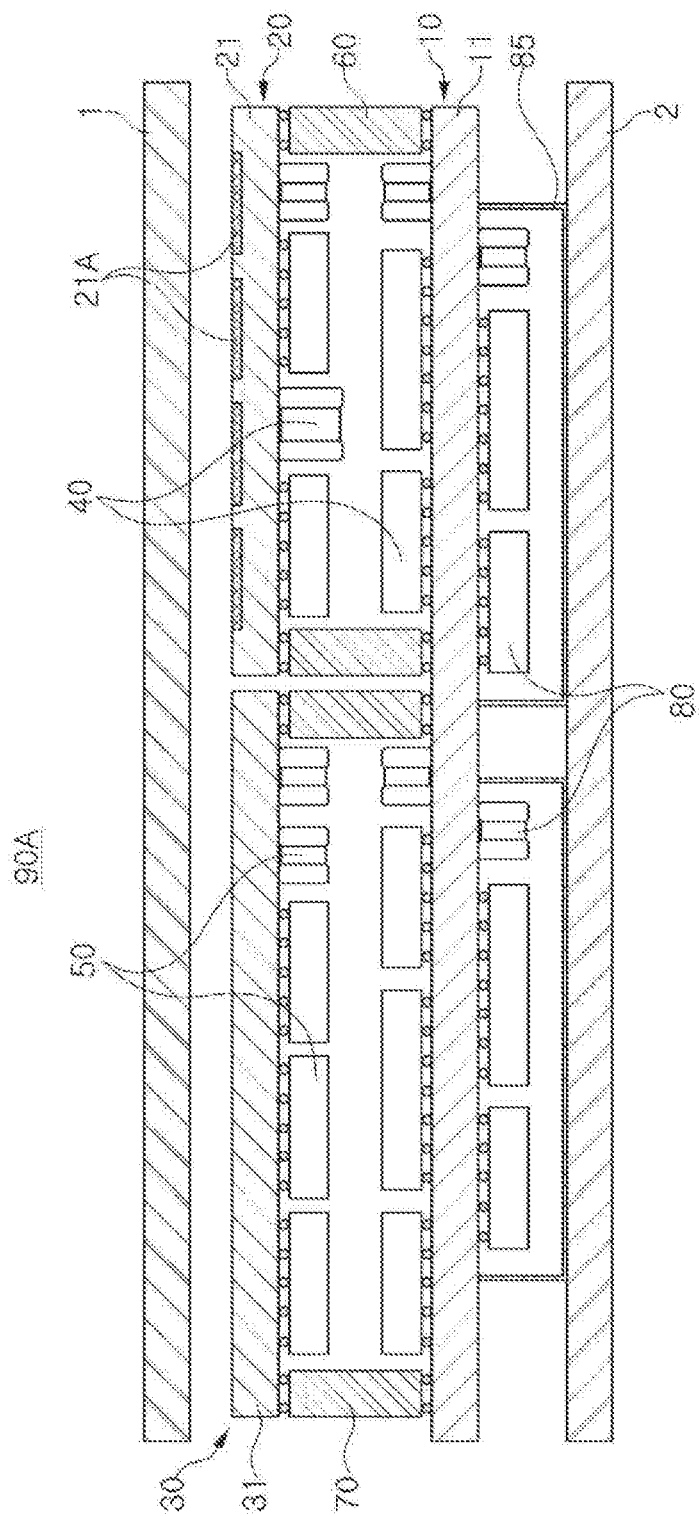
FIG. 11 is a schematic cross-sectional diagram illustrating a printed circuit board assembly according to an example embodiment.

FIG. 9 is a schematic exploded diagram illustrating a printed circuit board assembly 90A in accordance with an example illustrated in FIG. 11.

Referring to FIG. 9, the printed circuit board assembly 90A in the example embodiment may include a first printed circuit board 10 having a first side and a second side opposing the first side, a second printed circuit board 20 disposed on the first side of the first printed circuit board 10 and including an antenna pattern 21A, a third printed circuit board 30 disposed on the first side of the first printed circuit board 10 and spaced apart from the second printed circuit board 20, one or more first electronic components 40 disposed between the first printed circuit board 10 and the second printed circuit board 20 and electrically connected to at least one of the first printed circuit board 10 and the second printed circuit board 20, one or more second electronic components 50 disposed between the first printed circuit board 10 and the third printed circuit board 30, and electrically connected to at least one of the first printed circuit board 10 and the third printed circuit board 30, a first interposer substrate 60 disposed around the one or more first electronic components 40 and electrically connecting the first printed circuit board 10 and the second printed circuit board 20, and a second interposer substrate 70 disposed around the one or more second electronic components 50 and electrically connecting the first printed circuit board 10 and the third printed circuit board 30.

The printed circuit board assembly 90A may be disposed in an internal space of an electronic device such as a smartphone, or the like. As illustrated in the diagram, the first printed circuit board 10 may be mounted on a rear surface case 1 or a front surface case 2. Forms of the first to third printed circuit boards 10, 20, and 30 may not be limited to any particular form, and may vary depending on a disposing space in the electronic device. The first and second electronic components 40 and 50 may be mounted among the first to third printed circuit boards 10, 20, and 30. The first to third printed circuit boards 10, 20, and 30 and the first and second interposer substrates 60 and 70 may be coupled to each other through a surface mount technology (SMT) process.

The first printed circuit board 10 may occupy a significantly large area in the printed circuit board assembly, and may be mounted on the rear surface case 1 or the front surface case 2. A shape of the first printed circuit board 10 may not be limited to any particular shape, and may change depending on a case of the electronic device and an internal mounting space in the electronic device.

The second printed circuit board 20 may substantially include the antenna pattern 21A implementing a mmWave/5G Antenna, and the like, and may also include other ground patterns, feeding patterns, and the like (not illustrated). The antenna pattern 21A may be a dipole antenna, a patch antenna, or the like, depending on a disposed position and a shape of the antenna pattern 21A. The ground pattern may have a ground plane form. The antenna pattern 21A may be surrounded by a ground pattern (not illustrated) disposed on the same level, but an example embodiment thereof is not limited thereto.

One surface of the second printed circuit board 20 may be disposed adjacent to the rear surface case 1 or the front surface case 2 (in the diagram, the surface may be disposed adjacent to the rear surface case 1), and the first electronic component 40 may not be disposed on one surface adjacent to the rear surface case 1 or the front surface case 2 to transmit and receive a signal. Thus, one surface on which a wireless communication signal is transmitted and received through the antenna pattern 21A may be distinguished from the other surface on which the first electronic component 40 is mounted.

The first and second interposer substrates 60 and 70 may be disposed around the electronic component 40 and the second electronic component 50, respectively, and may have hollows 60H and 70H accommodating the first electronic component 40 and the second electronic component 50. The first and second interposer substrates 60 and 70 may include a conductive circuit (not illustrated) penetrating the first and second interposer substrates 60 and 70 in a thickness direction, and may electrically connect the first to third printed circuit boards 10, 20, and 30 through the conductive circuit. Thus, integration density of the electronic components may increase, and a thickness of the printed circuit board assembly may be significantly reduced.

Although not illustrated, the electronic component may also be mounted in a partial region of the first printed circuit board 10 which may not be covered by the second printed circuit board 20 and the third printed circuit board 30. The partial region of the first printed circuit board 10 which may not be covered by the second printed circuit board 20 and the third printed circuit board 30 may include a partial region of the first surface opposing the second printed circuit board 20 and the third printed circuit board 30 which may not overlap the second printed circuit board 20 and the third printed circuit board 30, and the second surface opposing the first surface.

Figure 10A:
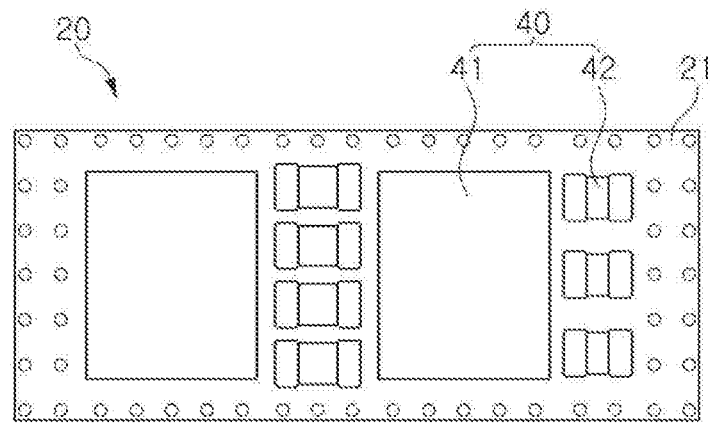
FIGS. 10A and 10B are schematic diagrams illustrating portions of elements illustrated in FIG. 9, viewed from the below.
Figure 10B:
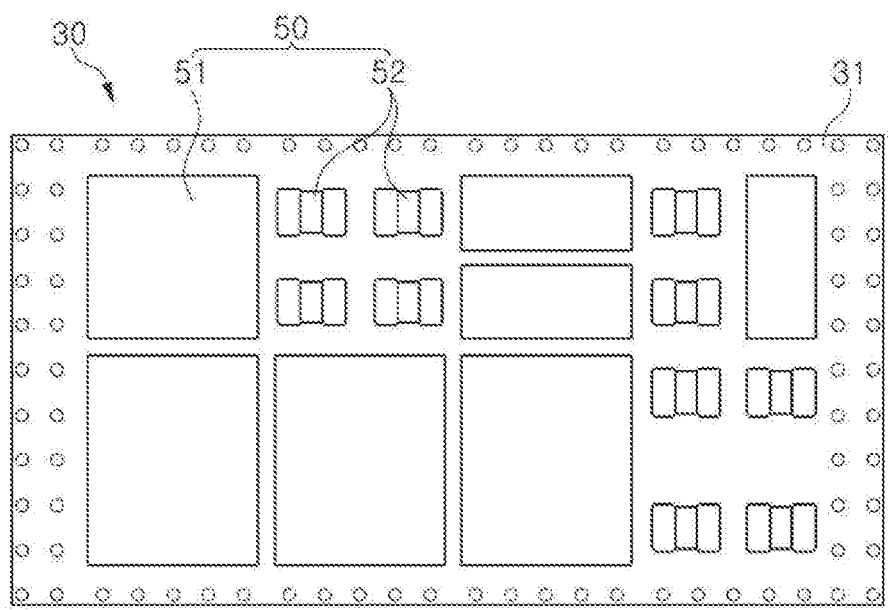

FIGS. 10A and 10B are diagrams illustrating portions of elements illustrated in FIG. 9, viewed from below.

Referring to FIGS. 10A and 10B, a first electronic component 40 and a second electronic component 50 may be mounted on surfaces of a second printed circuit board 20 and a third printed circuit board 30 opposing a first printed circuit board 10, respectively. The electronic component may not be disposed on the other surface of the second printed circuit board 20 including an antenna pattern, which opposes the surface opposing the first printed circuit board 10. Although not illustrated, the electronic component may be disposed on the other surface of the third printed circuit board 30, which opposes the surface opposing the first printed circuit board 10.

Each of the second and third printed circuit boards 20 and 30 may be a well-known printed circuit board including insulating layers 21 and 31, respectively, and including a circuit pattern (not illustrated). The insulating layers 21 and 31 may include an insulating material, and as the insulating material, a thermosetting resin such as an epoxy resin, a thermoplastic resin such as a polyimide resin, or a material including a reinforcement such as an inorganic filler along with the above-mentioned resins, such as an Ajinomoto build-up film (ABF), for example, may be used. However, an example of the material is not limited thereto, and other than the above-mentioned materials, photo imageable dielectric (PID), and the like, may be used. Even when materials of the insulating layers 21 and 31 are the same, a boundary between the materials may be distinct. The first printed circuit board 10 may also be the same well-known printed circuit board as the second printed circuit board 20 and the third printed circuit board 30.

The circuit pattern may substantially include an antenna pattern implementing mmWave/5G Antenna, and the like, and may also include other ground patterns, a feeding pattern, and the like. The antenna pattern may be a dipole antenna, a patch antenna, or the like, depending on a disposed position and a shape of the antenna pattern. The ground pattern may have a ground plane form. The antenna pattern may be surrounded by a ground pattern (not illustrated) disposed on the same level, but an example embodiment thereof is not limited thereto. The circuit pattern may further include a signal pattern, a power pattern, a resistance pattern, and the like.

As a material of the circuit pattern, a conductive material such as copper (Cu), aluminum (Al), silver (Ag), tin (Sn), gold (Au), nickel (Ni), lead (Pb), titanium (Ti), or alloys thereof, may be used, but an example of the material may not be limited thereto. Also, as a method of forming the circuit pattern, the circuit pattern may be formed by coating an insulating layer of a copper clad laminate with a dry film and performing exposure, developing, and etching processes depending on a certain pattern, or may be formed by heating or pressuring the insulating layer in a semi-cured state including a circuit pattern formed in advance.

The first and second electronic components 40 and 50 may be various types of active components and/or passive components. The first and second electronic components 40 and 50 may be integrated circuits (IC) 41 and 51, and/or may be passive components 42 and 52 such as a capacitor or an inductor. The first and second electronic components 40 and 50 may be the same type of electronic component, or may be different types of electronic components. The first and second electronic components 40 and 50 may be mounted on the second and third printed circuit boards 20 and 30, respectively, through a metal having a low melting point, and may be electrically connected to the circuit pattern of each printed circuit board. Alternatively, the first and second electronic components 40 and 50 may be mounted in a package form including a redistribution layer connected to the printed circuit boards.

The first electronic component 40 mounted on the second printed circuit board 20 including an antenna pattern may include a radio frequency integrated circuit (RFIC) and a power management integrated circuit (PMIC). Accordingly, a signal path of the radio frequency integrated circuit and the antenna pattern may be shortened, and signal loss may be significantly reduced.

FIG. 11 is a schematic cross-sectional diagram illustrating a printed circuit board assembly 90A according to an example embodiment.

Referring to FIG. 11, the printed circuit board assembly 90A in the example embodiment may include a second printed circuit board 20 including an antenna pattern 21A and including at least one first electronic component 40 disposed therein, a third printed circuit board 30 spaced apart from the second printed circuit board 20 and including at least one second electronic component 50 mounted thereon, a first printed circuit board 10 opposing the second printed circuit board 20 and the third printed circuit board 30 and including at least one of the first electronic component 40 and the second electronic component 50 mounted thereon, a first interposer substrate 60 disposed between the first printed circuit board 10 and the second printed circuit board 20 and disposed around the first electronic component 40, and a second interposer substrate 70 disposed between the first printed circuit board 10 and the third printed circuit board 30 and disposed around the second electronic component 50.

The first printed circuit board 10 may be a well-known printed circuit board including an insulating layer 11 and a circuit pattern (not illustrated). The insulating layer 11 may include an insulating material, and as the insulating material, a generally used insulating material such as an epoxy resin, for example, may be used. The circuit pattern may include a conductive material, and may be formed by coating an insulting layer of a copper clad laminate with a dry film, and performing exposure, developing, and etching processes depending on a certain pattern, or may be formed by heating or pressuring the insulating layer in a semi-cured state including a circuit pattern formed in advance.

Additional first and second electronic components 40 and 50 may be disposed on one surface of the first printed circuit board 10 opposing the second printed circuit board and the third printed circuit board 30, and a third electronic component 80 may be disposed on the other surface opposing the one surface of the first printed circuit board 10. Thus, the third electronic component 80 disposed on a lower surface of the first printed circuit board 10 and/or a third electronic component (not illustrated) disposed on an upper surface of the third printed circuit board 30 may further be included in addition to the first electronic component 40 and a second electronic component 50 disposed among the first printed circuit board 10, the second printed circuit board 20, and the third printed circuit board 30.

A metal layer covering portions of the first to third 40, 50, and 80 mounted on the first to third printed circuit boards 10, 20, and 30, which may require electromagnetic shielding, may be disposed. For example, a metal layer 85 covering the third electronic component 80 mounted on a lower surface of the first printed circuit board 10 may be included. By including the metal layer 85, the EMI shielding function of the printed circuit board assembly may further improve. The metal layer 85 may include a metal material, and the metal material may be copper (Cu), aluminum (Al), silver (Ag), tin (Sn), gold (Au), nickel (Ni), lead (Pb), titanium (Ti), or alloys thereof.

Figure 12:
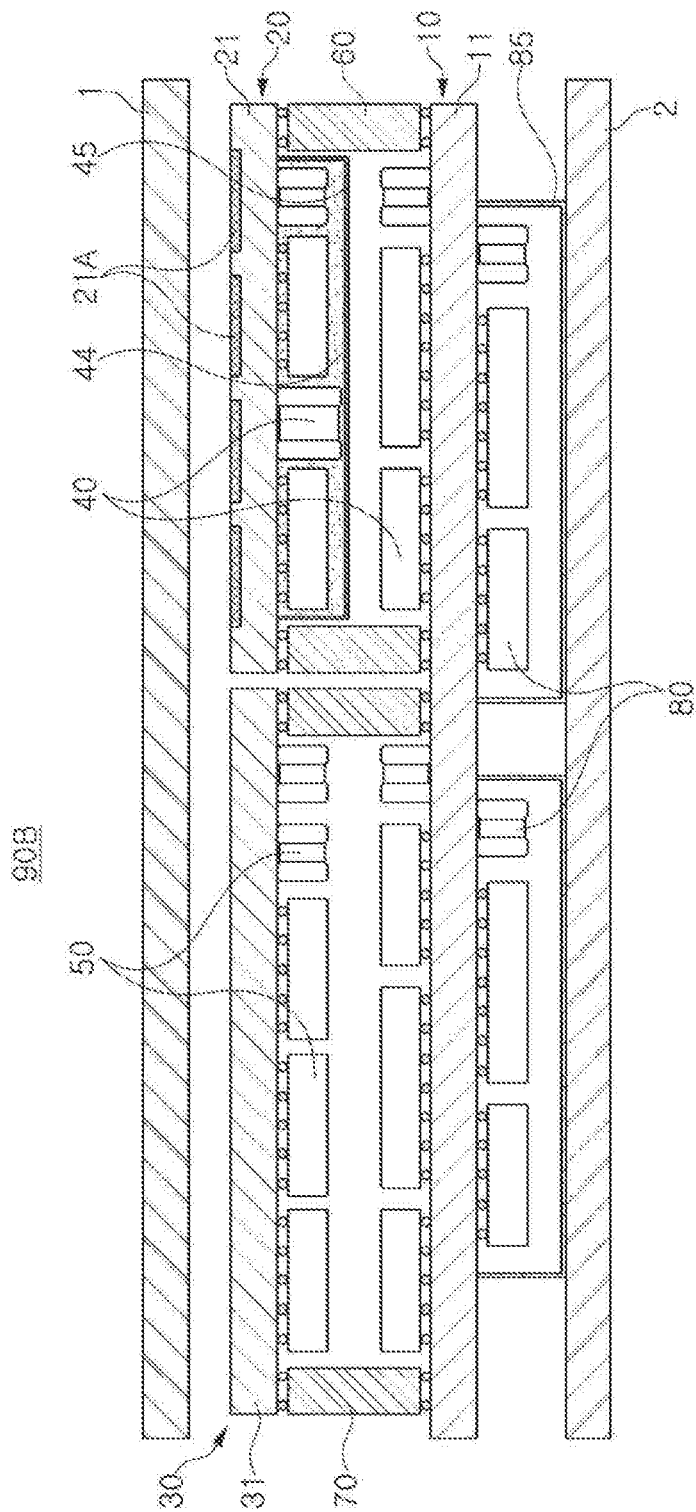
FIGS. 12 to 20 are schematic cross-sectional diagrams illustrating a printed circuit board assembly according to example embodiments.

FIG. 12 is a schematic cross-sectional diagram illustrating a printed circuit board assembly 90B according to another example embodiment.

Referring to FIG. 12, the printed circuit board assembly 90B may further include an encapsulant 44 encapsulating at least one of first electronic components 40 disposed on a lower surface of a second printed circuit board 20, and a metal layer 45 configured to cover an external surface of the encapsulant 44.

The encapsulant 44 may be configured to protect the first electronic components 40 and to provide an insulating region. An encapsulating form may not be limited to any particular form, and the encapsulant 44 may surround at least a portion of the first electronic component 40. For example, the encapsulant 44 may cover a lower surface and each of side surfaces of the first electronic component 40. A specific material of the encapsulant 44 may not be limited to any particular material, and an insulating material such as an ABF may be used. If desired, a photo imageable encapsulant (PIE) may be used. Also, if desired, the encapsulant 44 may include a first encapsulant encapsulating a passive component 42 and a second encapsulant encapsulating a semiconductor chip 41. Also, although not illustrated, encapsulants encapsulating second and third electronic components 50 and 80 may further be included, and a metal layer covering each of external surfaces of the encapsulants may be formed.

The metal layer 45 may be formed on an external surface of the encapsulant 44 covering the first electronic component 40. By including the metal layer 45, an EMI shielding function of the printed circuit board assembly may further improve. The metal layer may include a metal material, and the metal material may be copper (Cu), aluminum (Al), silver (Ag), tin (Sn), gold (Au), nickel (Ni), lead (Pb), titanium (Ti), or alloys thereof.

The descriptions of the other elements may be the same as the descriptions of the elements of the printed circuit board assembly 90A described in the aforementioned example embodiment, and thus, detailed descriptions thereof will not be repeated.

Figure 13:
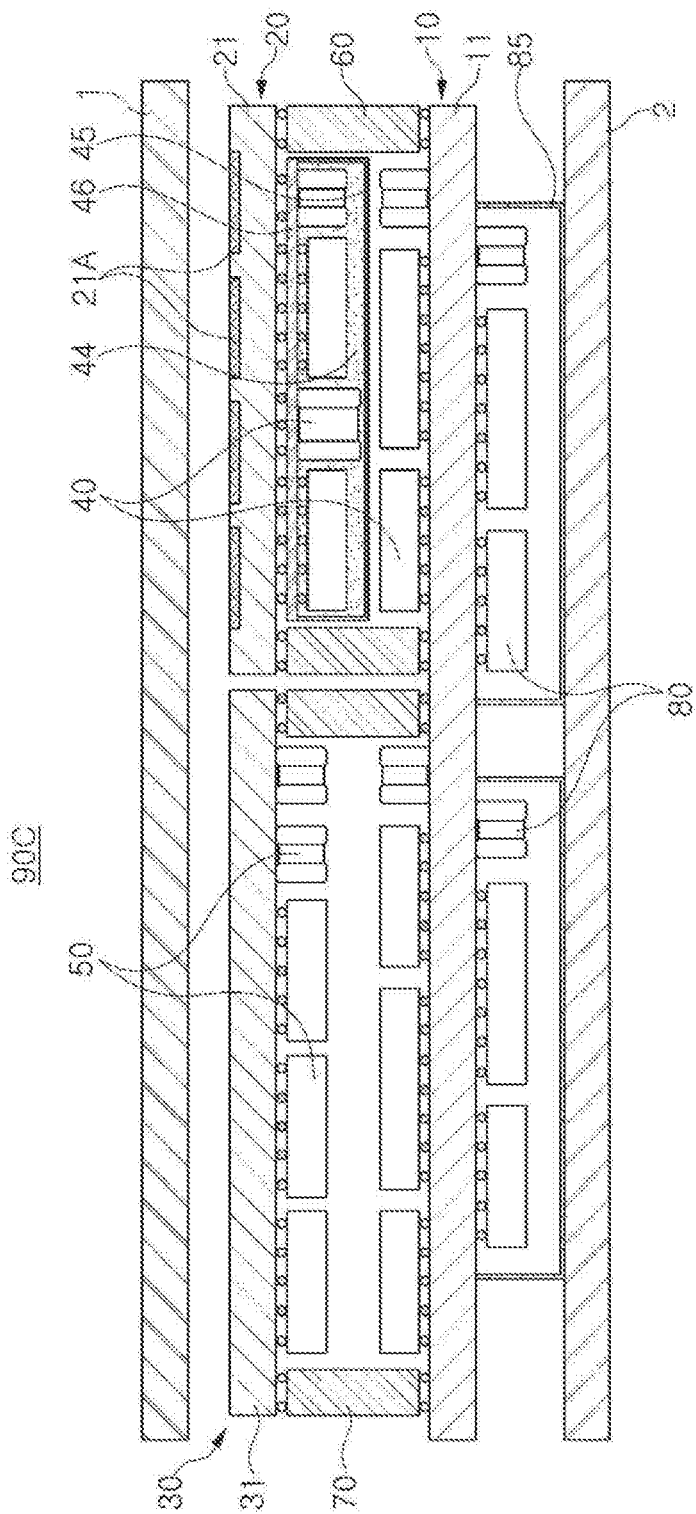

FIG. 13 is a schematic cross-sectional diagram illustrating a printed circuit board assembly 90C according to another example embodiment.

Referring to FIG. 13, the printed circuit board assembly 90C may include an interconnect structure 46, on which at least one of first electronic components 40 is disposed, electrically connected to the second printed circuit board 20, an encapsulant 44 encapsulating at least a portion of the first electronic component 40 disposed on the interconnect structure 46, and a metal layer 45 configured to cover an external surface of the encapsulant 44.

The interconnect structure 46 may redistribute the first electronic components 40. The interconnect structure 46 may electrically connect the first electronic components 40 to each other, and may provide an electrical connection path to a second printed circuit board 20 including an antenna pattern 21A. The interconnect structure 46 may be configured as a single layer, or may include a plurality of layers. Thus, the first electronic components 40 mounted on a lower surface of an insulating layer 21 of the second printed circuit board 20 may be embedded in a single package and may be mounted on the second printed circuit board 20, and an electromagnetic interference (EMI) shielding function of the first electronic components may improve by including the metal layer 45 covering the external surface.

The descriptions of the other elements may be the same as the descriptions of the elements of the printed circuit board assemblies described in the aforementioned example embodiments, and thus, detailed descriptions thereof will not be repeated.

Figure 14:
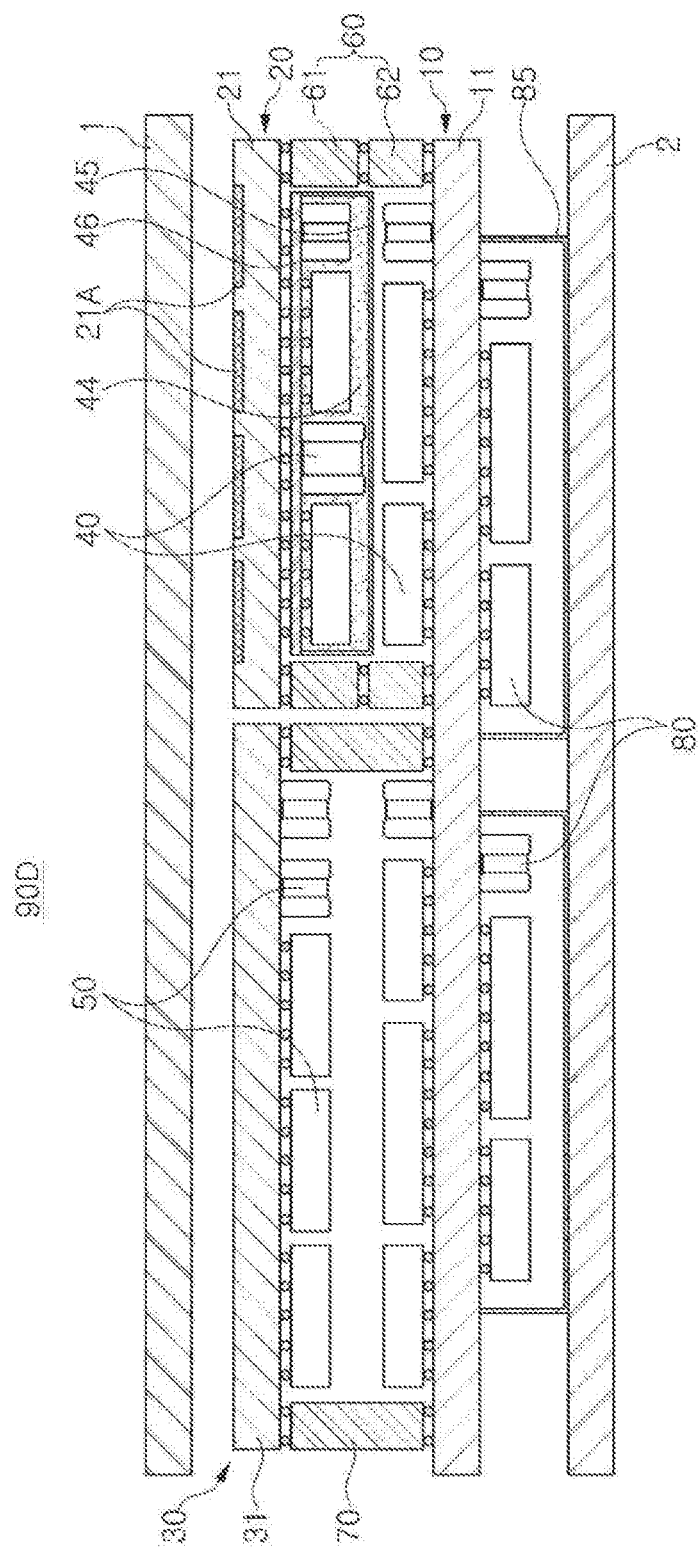

FIG. 14 is a cross-sectional diagram illustrating a printed circuit board assembly 90D according to another example embodiment.

Referring to FIG. 14, a first interposer substrate 60 of the printed circuit board assembly 90D in another example embodiment may include an upper interposer substrate 61 disposed around at least one first electronic component 40 disposed on a lower surface of the second printed circuit board 20, and a lower interposer substrate 62 disposed around at least one first electronic component 40 disposed on an upper surface of the first printed circuit board 10. The upper interposer substrate 61 and the lower interposer substrate 62 may be connected to each other in a thickness direction. The upper interposer substrate 61 and the lower interposer substrate 62 may be spaced apart from each other, and a height of each of the upper interposer substrate 61 and the lower interposer substrate 62 may be less than a height of a second interposer substrate 70 accommodating a second electronic component 50. By dividing the first interposer substrate 60 into the upper and lower interposer substrates 61 and 62, a gap between the first electronic component 40 disposed on the upper surface of the first printed circuit board 10 and the first electronic component disposed on the lower surface of the second printed circuit board 20 may be further decreased.

The descriptions of the other elements may be the same as the descriptions of the elements of the printed circuit board assemblies described in the aforementioned example embodiments, and thus, detailed descriptions thereof will not be repeated.

Figure 15:
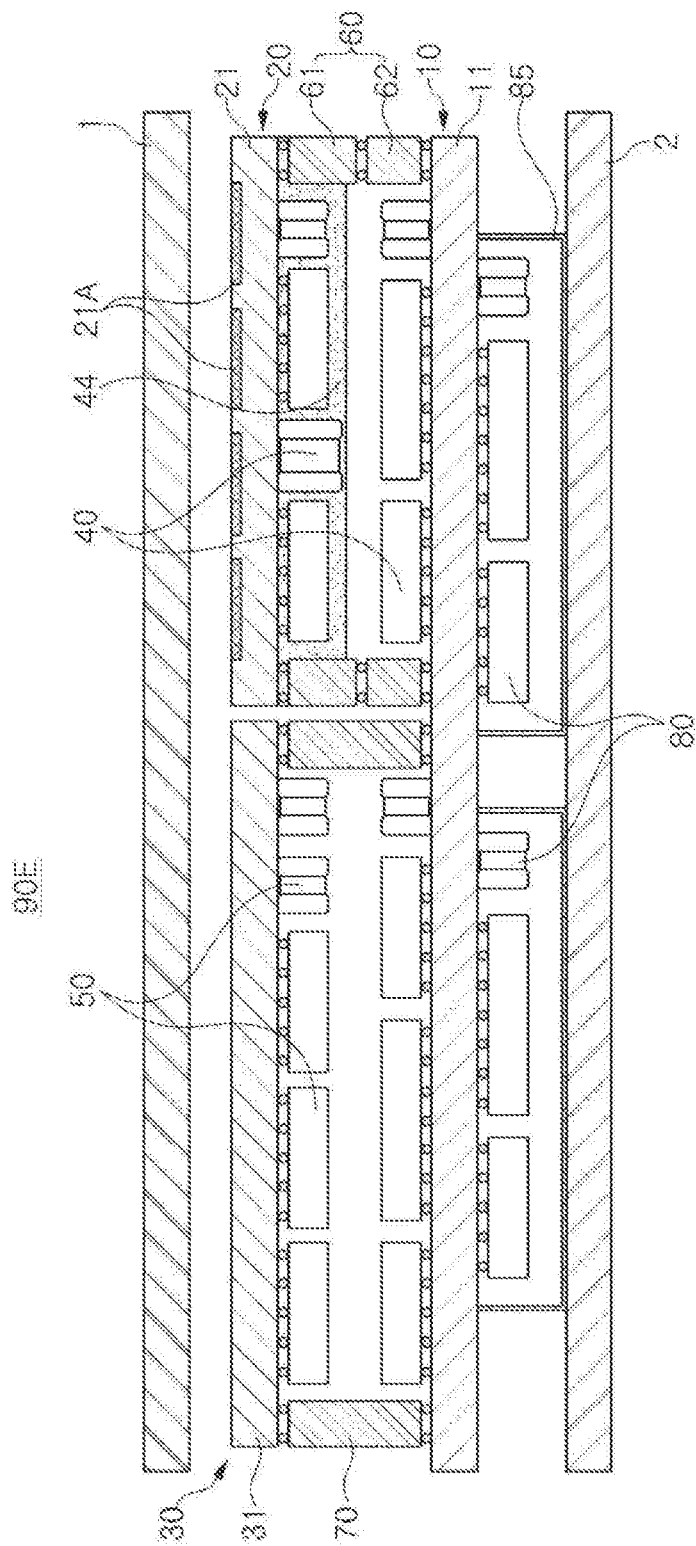

FIG. 15 is a schematic cross-sectional diagram illustrating a printed circuit board assembly 90E according to another example embodiment.

Referring to FIG. 15, the printed circuit board assembly 90E in another example embodiment may further include an encapsulant 44 encapsulating an upper interposer substrate 61 and at least one first electronic component 40 disposed on a lower surface of the second printed circuit board 20. By including the encapsulant 44 covering the first electronic component 40 and a side surface of the upper interposer substrate 61, the first electronic component 40 and the upper interposer substrate 61 may be protected from external impacts, and connection reliability may improve.

If desired, a printed circuit board assembly in another example may further include an encapsulating (not illustrated) covering a second electronic components 50 or a third electronic component 80, or a second interposer substrate 70 may be divided into an upper interposer substrate and a lower interposer substrate (not illustrated), and the descriptions thereof will be the same as in the aforementioned example embodiment.

The descriptions of the other elements may be the same as the descriptions of the elements of the printed circuit board assemblies described in the aforementioned example embodiments, and thus, detailed descriptions thereof will not be repeated.

Figure 16:
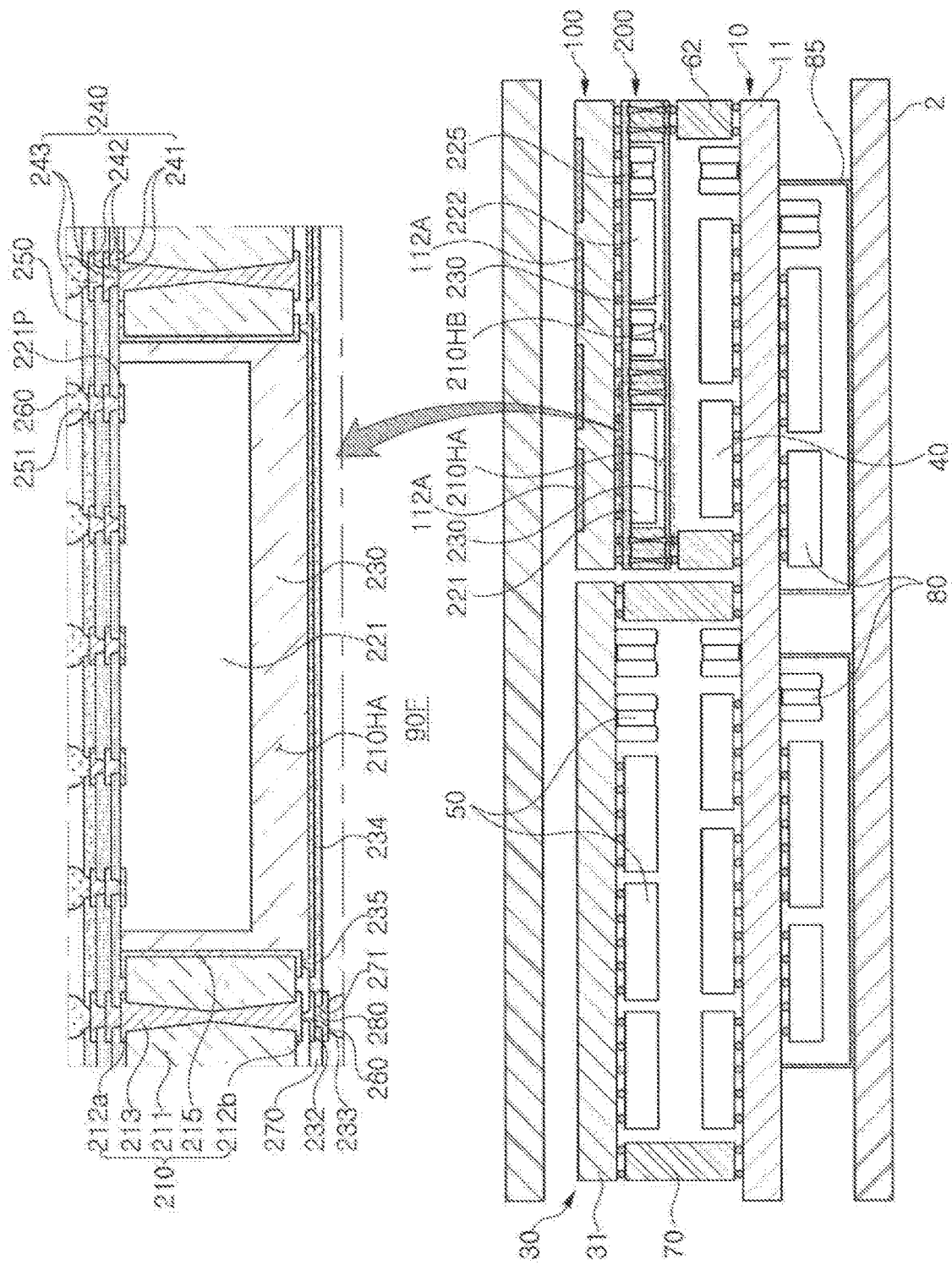

FIG. 16 is a schematic cross-sectional diagram illustrating a printed circuit board assembly 90F according to another example embodiment.

Referring to FIG. 16, the printed circuit board assembly 90F in another example embodiment may include an antenna module in which a semiconductor package 200 including at least one semiconductor chip 221 and 222 which includes a second printed circuit board 100 including an antenna pattern 112A, and a first electronic component 40, is integrated. A first interposer substrate 62 disposed around the at least one first electronic component 40 disposed on an upper surface of the first printed circuit board 10 and electrically connected to the semiconductor package 200 may have a height less than a height of a second interposer substrate 70 disposed between a third printed circuit board 30 and a first printed circuit board 10.

The second printed circuit board 100 including the antenna pattern 112A may be a region which may implement mmWave/5G Antenna, and may include the antenna pattern 112A and a ground pattern (not illustrated). For example, the second printed circuit board 100 may include a core layer, an insulating layer, a passivation layer, a wiring layer, and a connection via layer, and the insulating layers may be built up on both sides with reference to the core layer. The wiring layer may be disposed on the core layer and each of the insulating layers, and the wiring layers may be electrically connected to each other through the connection via layer penetrating the core layer and each of the insulating layers.

The semiconductor package 200 may include a frame 210 having a first through-hole 210HA and a second through-hole 210HB spaced part from the first through-hole 210HA, a first semiconductor chip 221 disposed in the first through-hole 210HA, and having a first active surface including a first connection pad 221P disposed thereon and a first inactive surface opposing the first active surface, a second semiconductor chip 222 disposed in the second through-hole 210HB and having a second active surface including a second connection pad (not illustrated) disposed thereon and a second inactive surface opposing the second active surface, an encapsulant 230 covering at least a portion of each of the frame 210, the first inactive surface of the first semiconductor chip 221 and the second inactive surface of the second semiconductor chip 222 and filling at least a portion of each of the first through-hole 210HA and the second through-hole 210HB, and an interconnect structure 240 disposed on the frame 210, the first active surface of the first semiconductor chip 221, and the second active surface of the second semiconductor chip 222, and including a redistribution layer 242 electrically connected to the first connection pad and the second connection pad.

The frame 210 may further include a metal layer 215 disposed on walls of the first and second through-holes 210HA and 210HB and extending to a lower surface of the frame 210. The frame 210 may also include a backside metal layer 234 disposed on a lower surface of the encapsulant 230 and a backside metal via 235 penetrating the encapsulant 230 and connecting the backside metal layer 234 to the metal layer 215 of the frame 210. In the diagram, only the elements around the first through-hole 210HA are magnified and illustrated, and the second through-hole 210HB may also have the same elements.

Thus, by including the metal layer 215 disposed on a wall of each of the through-holes 210HA and 210HB, the backside metal via 235 connected to the metal layer 215, and the backside metal layer 234, an integrated circuit disposed in the through-holes 210HA and 210HB may be shielded from electromagnetic interference (EMI). A passive component 225 may be disposed in the second through-hole 210HB along with an integrated circuit such as the second semiconductor chip 222, and when the integrated circuit is a power management integrated circuit (PMIC), the integrated circuit may be disposed along with a plurality of the passive components 225. Also, differently from the example illustrated in the diagram, a plurality of passive components may disposed in a third through-hole spaced apart from the first through-hole 210HA and the second through-hole 210HB separately.

In the description below, elements of a semiconductor package 200 will be described in greater detail according to an example embodiment with reference to the drawings.

As the frame 210 includes wiring layers 212a and 212b, the number of layers of the interconnect structure 240 may decrease. Also stiffness of a semiconductor package 200A may further improve depending on a specific material of an insulating layer 211, and the encapsulant 230 may secure a uniform thickness, and the like. By including the wiring layers 212a and 212b and a connection via 213 of the frame 210, an upper/lower electrical path may be provided in the semiconductor package 200. The frame 210 may have first and second through-holes 210HA and 210HB. A first semiconductor chip 221, a second semiconductor chip 222, and a passive component 225 may be disposed in each of the first and second through-holes 210HA and 210HB side by side, and may be spaced part from the frame 210 by a certain distance. The semiconductor chips 221 and 222 and side surfaces of the passive component 225 may be surrounded by the frame 210. However, an example embodiment thereof may not be limited to the above-described example and other various modified examples may be made, and different functions may be implemented example embodiments.

The frame 210 may include an insulating layer 211, a first wiring layer 212a disposed on an upper surface of the insulating layer 211, a second wiring layer 212b disposed on a lower surface of the insulating layer 211, and a connection via 213 penetrating the insulating layer 211 and electrically connecting the first and second wiring layers 212a and 212b. The first and second wiring layers 212a and 212b of the frame 210 may have a thickness greater than a thickness of the redistribution layer 242 of an interconnect structure 240. As the frame 210 may have a thickness similar to or greater than thicknesses of the semiconductor chips 221 and 222, the first and second wiring layers 212a and 212b may be configured to have a greater size through a substrate process in accordance with the scale of the frame 210. The redistribution layer 242 of the interconnect structure 240 may have a reduced size through a semiconductor process.

A material of the insulating layer 211 may not be limited to any particular material. For example, an insulating material may be used, and as the insulating material, a thermosetting resin such as an epoxy resin, a thermoplastic resin such as a polyimide resin, or a resin in which the above-mentioned resins are impregnated with an inorganic filler in a core material such as glass fiber (glass fiber, glass cloth, glass fabric, etc.), such as pregreg, for example, may be used, but the material may not be limited thereto. For example, as a material of the insulating layer 211, glass or a ceramic based insulating material may be applied to required material properties.

The wiring layers 212a and 212b may redistribute the connection pad 221P of the first semiconductor chip 221 and connection pads (no reference numeral) of the second semiconductor chip 222. The wiring layers 212a and 212b may also be used as a connection pattern when the semiconductor package 200 are electrically connected to other elements in an upper portion and a lower portion. As a material of the wiring layers 212a and 212b, a conductive material such as copper (Cu), aluminum (Al), silver (Ag), tin (Sn), gold (Au), nickel (Ni), lead (Pb), titanium (Ti), or alloys thereof, may be used. The wiring layers 212a and 212b may perform various functions depending on a design of respective layers. For example, the wiring layers 212a and 212b may include a ground (GrouND: GND) pattern, a power (PoWeR: PWR) pattern, a signal (Signal: S) pattern, and the like. A signal (S) pattern may include various signals other than a ground (GND) pattern, a power (PWR) pattern, and the like, such as a data signal, for example. Also, a via pad, and the like, may be included.

The connection via 213 may electrically connect the wiring layers 212a and 212b formed on different layers, and may thus form an electrical path in the frame 210. As a material of the connection via 213, a conductive material such as copper (Cu), aluminum (Al), silver (Ag), tin (Sn), gold (Au), nickel (Ni), lead (Pb), titanium (Ti), or alloys thereof, may be used. The connection via 213 may be completely filled with a conductive material, or a conductive material may be formed along a wall of the via hole. Also, the connection via 213 may have a well-known shape such as a shape of an hourglass, a cylindrical shape, or the like. The connection via 213 may also include a connection via for a signal, a connection via for a ground, and the like.

The metal layer 215 may further be disposed on walls of the through-holes 210HA and 210HB of the frame 210. The metal layer 215 may be formed on walls of the through-holes 210HA and 210HB and may surround the semiconductor chips 221 and 222 and the passive component 225. Accordingly, heat dissipation properties may improve, and an electromagnetic shielding effect may be implemented. The metal layer 215 may extend to an upper surface and a lower surface of the frame 210, an upper surface and a lower surface of the insulating layer 211. As a material of the metal layer 215, a conductive material such as copper (Cu), aluminum (Al), silver (Ag), tin (Sn), gold (Au), nickel (Ni), lead (Pb), titanium (Ti), or alloys thereof, may be used. The metal layer 215 may be electrically connected to the first wiring layer 212a and/or a ground pattern and/or a power pattern of the first wiring layer 212a, and may be used as a ground surface.

Each of the semiconductor chips 221 and 222 may be an integrated circuit (IC) of a bare state in which several hundreds to several millions of devices are integrated in a single chip. An integrated circuit (IC) of the first semiconductor chip 221 may be a radio frequency integrated circuit (RFIC), and an integrated circuit (IC) of the second semiconductor chip 222 may be a power management integrated circuit (PMIC).

Each of the semiconductor chips 221 and 222 may include a body in which various circuits are disposed, and a connection pad may be disposed on each of active surfaces of the body. The body may be formed based on an active wafer, and in this case, as a base material, silicon (Si), germanium (Ge), gallium arsenide (GaAs), and the like, may be used. The connection pad may be provided to electrically connect each of the semiconductor chips 221 and 222 to the other elements, and as a material of the connection pad, a conductive material, such as aluminum (Al), may be used, but the material is not limited thereto. In the semiconductor chips 221 and 222, a surface on which the connection pad is disposed may be an active surface, and a surface opposing the active surface may be an inactive surface. Although not illustrated, a passivation film (not illustrated) formed of an oxide film and/or a nitride film and having an opening for exposing at least a portion of the connection pad may be formed on the active surface of each of the semiconductor chips 221 and 222. Each of the semiconductor chips 221 and 222 may be disposed in a face-up form, and may thus have a significantly reduced signal path with the second printed circuit board 100.

The passive component 225 may be disposed side by side with semiconductor chips 221 and 222 in the first through-hole 210HA or the second through-hole 210HB. Alternatively, the passive component 225 may also be disposed in a third through-hole (not illustrated) spaced apart from the first and second through-holes 210HA and 210HB. The passive component 225 may be a well-known passive component such as a capacitor, an inductor, and the like. As an example embodiment, but not limited thereto, the passive component 225 may be a capacitor, more specifically a multilayer ceramic capacitor (MLCC). The passive component 225 may be electrically connected to each of the connection pads of the semiconductor chips 221 and 222 through the interconnect structure 240. The number of the passive components 225 may not be limited to any particular number.

The encapsulant 230 may be provided to protect the semiconductor chips 221 and 222, the passive component 225, and the like, and may provide an insulating region. An encapsulating form may not be limited to any particular form, and the encapsulant 230 may encapsulate at least portions of the semiconductor chips 221 and 222 and the passive component 225. For example, the encapsulant 230 may cover a lower surface of the frame 210, may cover side surfaces and the inactive surface of each of the semiconductor chips 221 and 222, and may cover side surfaces and a lower surface of the passive component 225. The encapsulant 230 may also fill a space in the first and second through-holes 210HA and 210HB. A specific material of the encapsulant 230 may not be limited to any particular material, and an insulating material such as an ABF may be used. If desired, a photo imageable encapsulant (PIE) may be used. Also, if desired, the encapsulant 230 may include a plurality of encapsulants, a first encapsulant encapsulating a passive component 225, a second encapsulant encapsulating semiconductor chips 221 and 222, and the like.

The backside wiring layer 232 and the backside metal layer 234 may be disposed on a lower surface of the encapsulant 230. The backside wiring layer 232 may be connected to the second wiring layer 212b of the frame 210 through the backside connection via 233 penetrating the encapsulant 230. The backside metal layer 234 may be connected to the metal layer 215 of the frame 210 through the backside metal via 235 penetrating the encapsulant 230. The above-described vias may include a conductive material such as copper (Cu), aluminum (Al), silver (Ag), tin (Sn), gold (Au), nickel (Ni), lead (Pb), titanium (Ti), or alloys thereof. The backside wiring layer 232 may include a signal pattern or a via pad for a signal, and the like. The backside metal layer 234 may cover the inactive surfaces of the semiconductor chips 221 and 222 and the passive component 225, and may be connected to the metal layer 215 through the backside metal via 235, thereby implementing an improved heat dissipation effect and an improved electromagnetic shielding effect. The backside metal layer 234 may be connected to a ground pattern and/or a power pattern of the wiring layers 212a and 212b of the frame 110 and may be used as a ground.

The interconnect structure 240 may redistribute the connection pads 221P of the first semiconductor chip 221 and connection pads (no reference numeral) of the second semiconductor chip 222. Several tens to several hundreds of connection pads of each of the semiconductor chips having various functions may be redistributed through the interconnect structure 240. Also, the interconnect structure 240 may electrically connect the connection pads of the semiconductor chips to the passive component 225. The interconnect structure 240 may also provide an electrical connection path with the second printed circuit board 100. The interconnect structure 240 may include an insulating layer 241, a redistribution layer 242 disposed on the insulating layer 241, and a redistribution via 243 penetrating the insulating layer 241 and connected to the redistribution layer 242. The interconnect structure 240 may be configured as a single layer, or may include a plurality of layers, a greater number of layers than in the example illustrated in the diagram.

As a material of the insulating layer 241, an insulating material may be used. As the insulating material, a photosensitive insulating material such as a PID resin may be used other than the above-described insulating material. Thus, the insulating layer 241 may be a photosensitive insulating layer. When the insulating layer 241 has photosensitivity, a thickness of the insulating layer 241 may further be reduced, and a fine pitch of the redistribution via 243 may be easily implemented. The insulating layer 241 may be a photosensitive insulating layer including an insulating resin and an inorganic filler. When the insulating layer 241 includes a plurality of layers, a material of the layers may be the same, or may be different if desired. When the insulating layer 241 includes a plurality of layers, the layers may be integrated with each other through a process such that a boundary therebetween may be indistinct.

The redistribution layer 242 may substantially redistribute the connection pads. As material of the redistribution layer 242, a conductive material such as copper (Cu), aluminum (Al), silver (Ag), tin (Sn), gold (Au), nickel (Ni), lead (Pb), titanium (Ti), or alloys thereof, may be used. The redistribution layer 242 may perform various functions depending on a design of a respective layer. For example, the redistribution layer 242 may include a ground (GrouND: GND) pattern, a power (PoWeR: PWR) pattern, a signal (Signal: S) pattern, and the like. A signal (S) pattern may include various signals other than a ground (GND) pattern, a power (PWR) pattern, and the like, such as a data signal, for example. Also, a via pad, a connection terminal pad, and the like, may be included. The redistribution layer 242 may also include a feeding pattern.

The redistribution via 243 may electrically connect the redistribution layer 242, the connection pads, and the like, formed on different layers, and may thus form an electrical path in the package 200A. As a material of the redistribution via 243, a conductive material such as copper (Cu), aluminum (Al), silver (Ag), tin (Sn), gold (Au), nickel (Ni), lead (Pb), titanium (Ti), or alloys thereof, may be used. The redistribution via 243 may be completely filled with a conductive material, or a conductive material may be formed along a wall of the via hole. Also, the redistribution via 243 may have a tapered shape, tapered in a direction opposite to tapered directions of the backside connection via 233 and the backside metal via 235. The redistribution via 243 may include a feeding via.

A first passivation layer 250 having an opening 251 exposing at least a portion of the redistribution layer 242 may be disposed in an upper portion of the interconnect structure 240. The first passivation layer 250 may protect the interconnect structure 240 from external physical and chemical damages, and other damages. The first passivation layer 250 may include an insulating resin and an inorganic filler, and may not include glass fiber. For example, the first passivation layer 250 may be an ABF, but a material of the first passivation layer 250 may not be limited thereto. A material of the first passivation layer 250 may be a PID or a solder resist, and the like.

A plurality of electrical connection metals 260 electrically connected to the exposed redistribution layer 242 may be disposed on the opening 251 of the first passivation layer 250. The electrical connection metal 260 may be provided to physically and/or electrically connect the semiconductor package 200 to the second printed circuit board 100. The electrical connection metal 260 may be formed of a metal having a low melting point, such as tin (Sn) or an alloy including tin (Sn), as a solder, for example, but a material of the connection metal 260 may not be limited thereto. The electrical connection metal 260 may be a land, a ball, a pin, or the like. The electrical connection metal 260 may include a plurality of layers or a single layer. When the electrical connection metal 260 includes a plurality of layers, the electrical connection metal 260 may include a copper pillar and a solder, and when the electrical connection metal 260 is configured as a single layer, the electrical connection metal 260 may include a tin-silver solder or a copper, but an example embodiment thereof is not limited thereto. The number, a gap, a disposed form, and the like, of the electrical connection metal 260 may not be limited to any particular example, and may vary in example embodiments.

At least one of the electrical connection metals 260 may be disposed in a fan-out region. The fan-out region may refer to a region beyond a region in which the semiconductor chips 221 and 222 are disposed. A fan-out package may have improved reliability as compared to a fan-in package, may implement a plurality of I/O terminals, and may easily perform 3D interconnection. Also, a thickness of a fan-out package may be further reduced and may be cost-competitive as compared to a ball grid array (BGA) package, a land grid array (LGA) package, and the like.

A second passivation layer 270 covering at least a portion of the backside wiring layer 232 and/or the backside metal layer 234 may be disposed in a lower portion of the encapsulant 230. The second passivation layer 270 may protect the backside wiring layer 232 and/or the backside metal layer 234 from external physical and chemical damages, and the like. The second passivation layer 270 may also include an insulating resin and an inorganic filler, and may not include glass fiber. For example, the second passivation layer 270 may be an ABF, but a material of the second passivation layer 270 may not be limited thereto, and may be a PID, a solder resist, or the like.

The second passivation layer 270 may also have an opening 271 exposing at least a portion of the backside wiring layer 232 and/or the backside metal layer 234. A plurality of electrical connection metals 260 electrically connected to the exposed backside wiring layer 232 and the backside metal layer 234 may be disposed on the opening 271. The electrical connection metals 260 disposed on the second passivation layer 270 may be provided to physically and/or electrically connect the semiconductor package 200 to the first interposer substrate 62.

An underbump metal 280 may improve connection reliability of the electrical connection metals 260 and may thus improve board level reliability of the package 200. The underbump metal 280 may be connected to the redistribution layers 242 and 342 or the backside wiring layer 232 and/or the backside metal layer 234 through the openings of the passivation layers 250 and 270. The underbump metal 280 may be formed in the opening by a metallization method using a conductive material, such as a metal, but the method may not be limited thereto. The underbump metal 280 may be included or may not be provided if desired, and in the example illustrated in the diagram, the underbump metal 280 is included in the opening 271 of the second passivation layer 270, and is not provided in the opening 251 of the first passivation layer 250.

The descriptions of the other elements may be the same as the descriptions of the elements of the printed circuit board assemblies described in the aforementioned example embodiments, and thus, detailed descriptions thereof will not be repeated.

Figure 17:
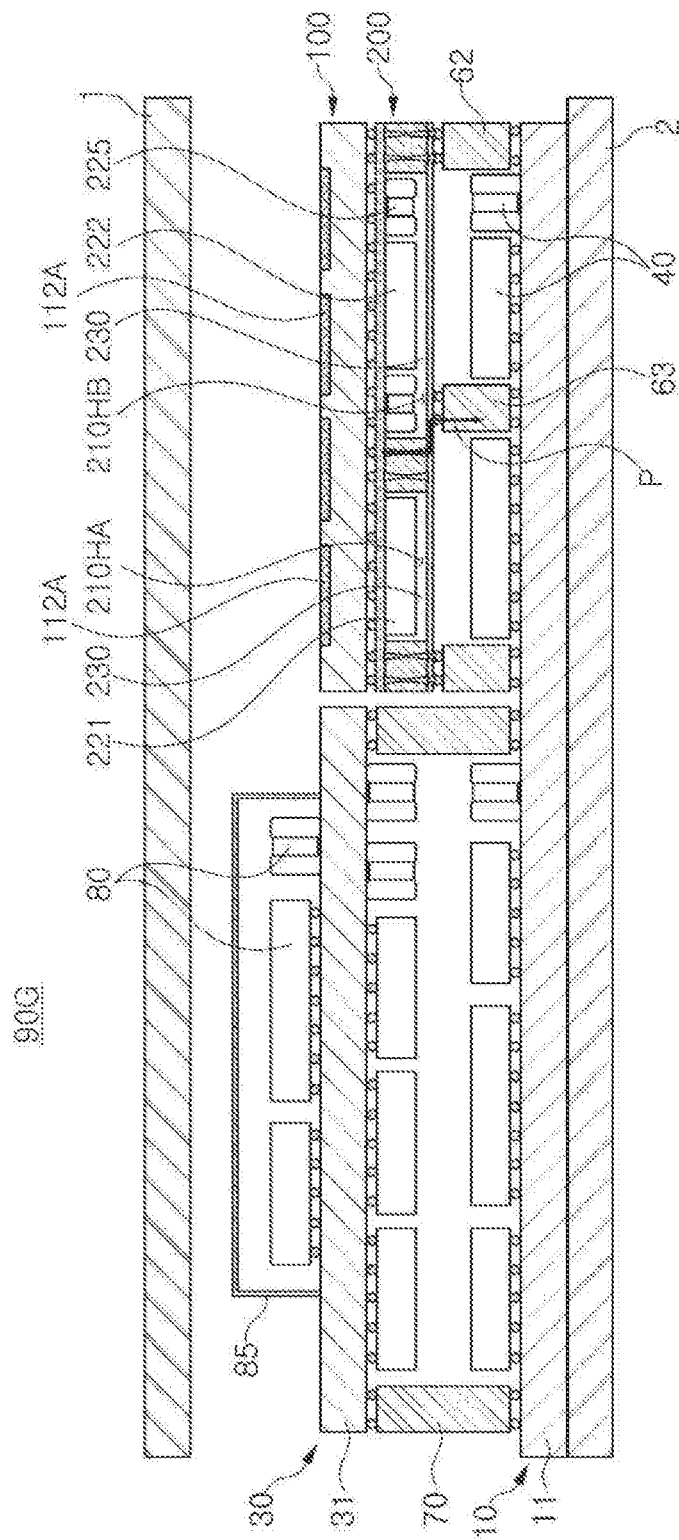

FIG. 17 is a cross-sectional diagram illustrating a printed circuit board assembly 90G according to another example embodiment.

Referring to FIG. 17, a first interposer substrate 62 of the printed circuit board assembly 90G may include a first auxiliary interposer substrate 63 disposed between the first interposer substrates 62, and electrically connected to at least one of a backside wiring layer and a backside metal layer disposed on a lower surface of an encapsulant 230 of a semiconductor package 200. An electrical path P through the semiconductor package 200 and connected to a first printed circuit board 10 may be additionally secured by including the first auxiliary interposer substrate 63.

Third electronic components 80 may be disposed on an upper surface of the third printed circuit board 30, and at least one of the third printed circuit boards 30 may be covered by a metal layer 85 and may be shielded from electromagnetic interference. In this case, to reduce a thickness of the printed circuit board assembly, an electronic component may not be disposed on a lower surface of the first printed circuit board 10.

The descriptions of the other elements may be the same as the descriptions of the elements of the printed circuit board assemblies described in the aforementioned example embodiments, and thus, detailed descriptions thereof will not be repeated.

Figure 18:
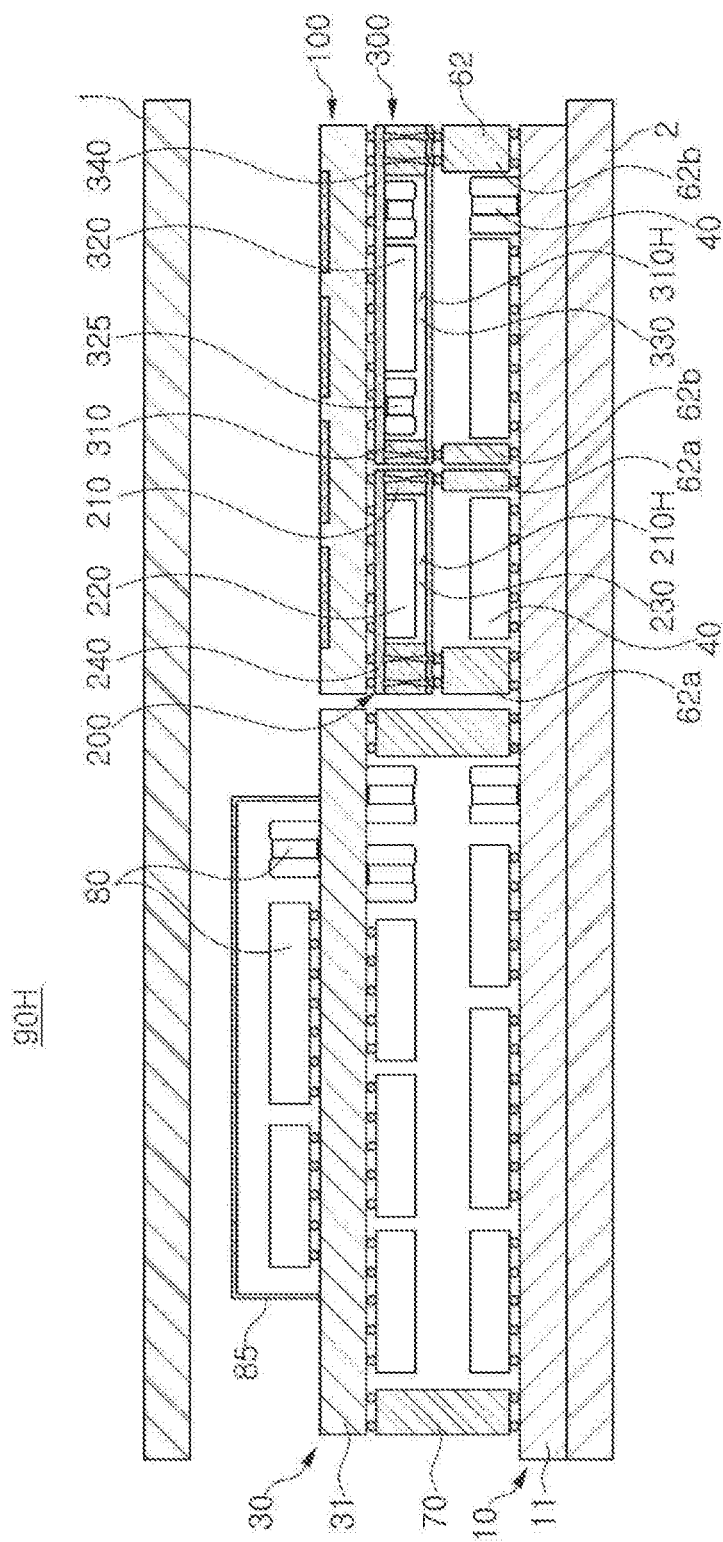

FIG. 18 is a cross-sectional diagram illustrating a printed circuit board assembly 90H according to another example embodiment.

Referring to FIG. 18, the printed circuit board assembly 90H in the example embodiment may include a first package 200 including a first semiconductor chip 220 embedded therein and a second package 300 including a second semiconductor chip 320 embedded therein, which are disposed on a lower surface of a second printed circuit board 100. The first package 200 and the second package 300 may be individual packages each of which includes a radio frequency integrated circuit (RFIC) 220 and a power management integrated circuit (PMIC) 320, and a passive component 325 may also be embedded therein depending on a function of each of the integrated circuits.

For example, the first package 200 may include a first frame 210 having a first through-hole 210H, a first semiconductor chip 220 disposed in the first through-hole 210H and having a first active surface on which a first connection pad is disposed and a first inactive surface opposing the first active surface, a first encapsulant 230 covering at least portions of the first frame 210 and the first inactive surface of the first semiconductor chip 220 and filling at least a portion of the first through-hole 210H, and a first interconnect structure 240 disposed on the first frame 210 and the first active surface of the first semiconductor chip 220 and including a redistribution layer electrically connected to the first connection pad.

A second package 300 may include a second frame 310 having a second through-hole 310H, a second semiconductor chip 320 disposed in the second through-hole 310H and having a second active surface on which a second connection pad is disposed and a second inactive surface opposing the second active surface, a passive component 325 disposed in the second through-hole 310H and disposed side by side with the second semiconductor chip 320, a second encapsulant 330 covering at least portions of the second frame 310, the second inactive surface of the second semiconductor chip 320, and the passive component and filling at least a portion of the second through-hole 310H, and a second interconnect structure 340 disposed on the second frame 310 and the second semiconductor chip 320 and including a redistribution layer electrically connected to the second connection pad.

The first interposer substrate 62 may include a first isolation substrate 62a disposed between the semiconductor package 200 and the first printed circuit board 10 and having a hollow accommodating at least one of first electronic components 40, and a second isolation substrate 62b disposed between the second semiconductor package 300 and the first printed circuit board 10 and having a hollow accommodating the at least one of first electronic components 40. Accordingly, by dividing the first interposer substrate into the first and second isolating substrates 62a and 62b, an electrical path between the second printed circuit board 100 and the third printed circuit board 30 may be reduced, and an additional heat dissipation path may be secured, thereby improving heat dissipation of the printed circuit board assembly.

The descriptions of the other elements may be the same as the descriptions of the elements of the printed circuit board assemblies described in the aforementioned example embodiments, and thus, detailed descriptions thereof will not be repeated.

Figure 19:
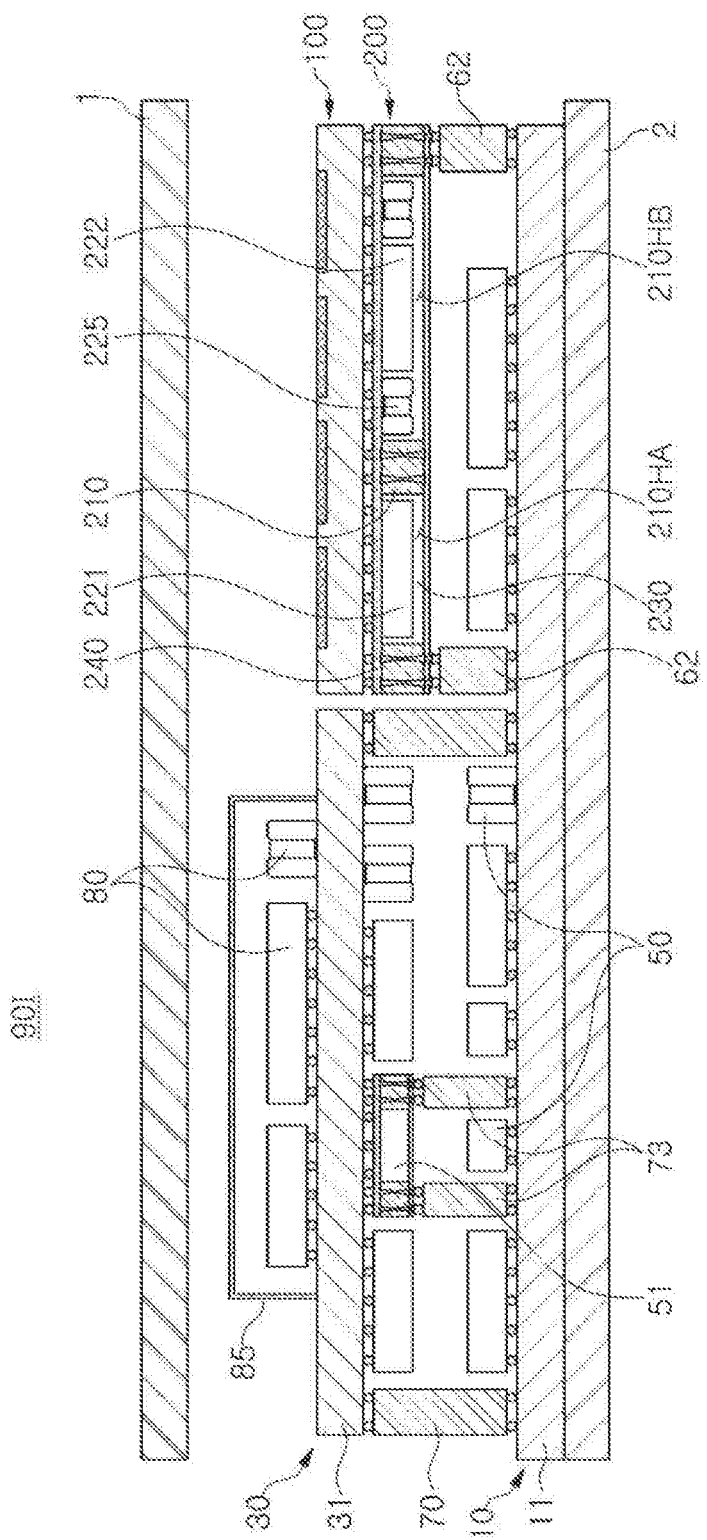

FIG. 19 is a cross-sectional diagram illustrating a printed circuit board assembly 90I according to another example embodiment.

Referring to FIG. 19, the printed circuit board assembly 90I in another example embodiment may further include a second auxiliary interposer substrate 73 disposed between second interposer substrates 70 and having a hollow accommodating at least one of second electronic components 50. By including the second auxiliary interposer substrate 73, an electrical path through which the second electronic component 50 disposed on a lower surface of the third printed circuit board 30 is connected to a first printed circuit board 10 may be reduced. A second electronic component 51 disposed on a lower surface of the third printed circuit board 30 and connected to the second auxiliary interposer substrate 73 may be a semiconductor chip embedded in the semiconductor package 200 described in the aforementioned example embodiment.

The descriptions of the other elements may be the same as the descriptions of the elements of the printed circuit board assemblies described in the aforementioned example embodiments, and thus, detailed descriptions thereof will not be repeated.

Figure 20:
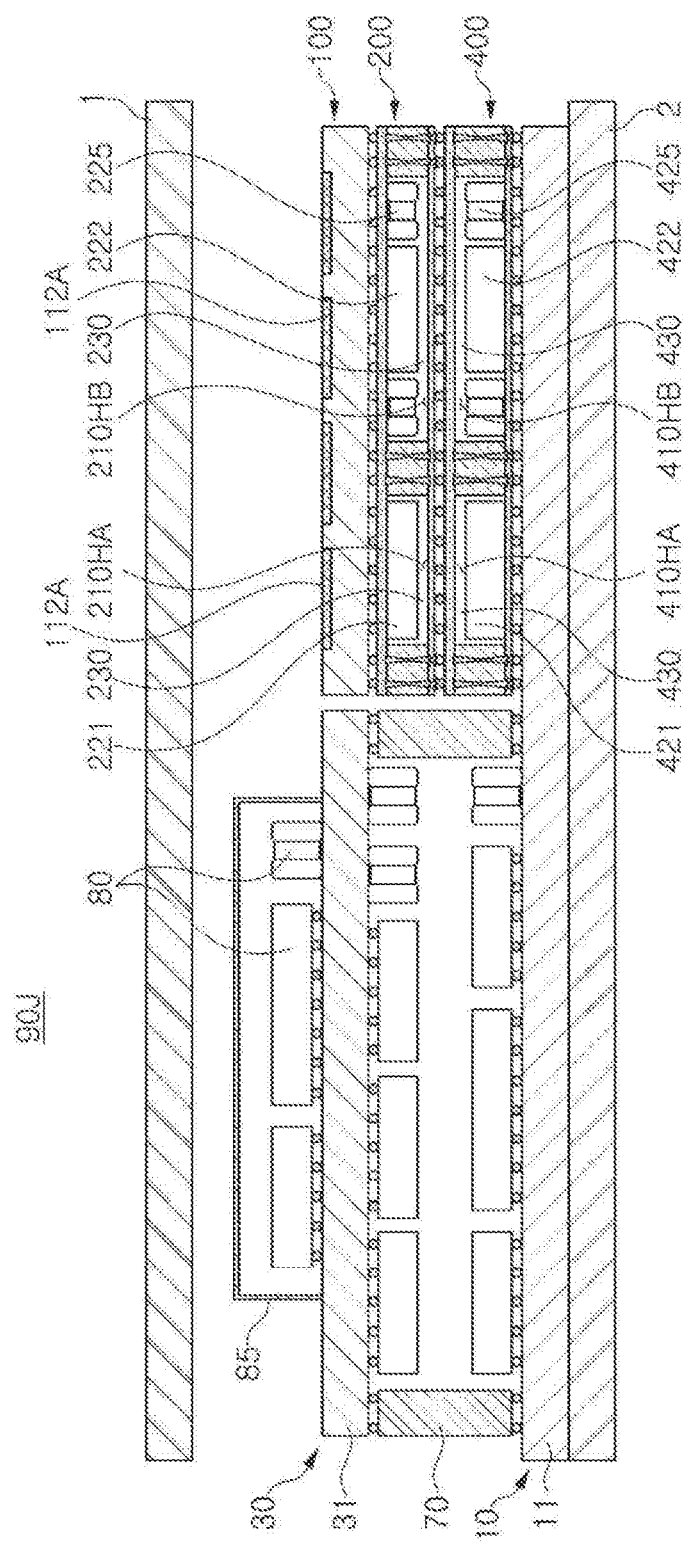

FIG. 20 is a cross-sectional diagram illustrating a printed circuit board assembly 90J according to another example embodiment.

Referring to FIG. 20, a second semiconductor package 400 disposed in a lower portion of a first semiconductor package 200 and including a third semiconductor chip 421, a fourth semiconductor chip 422, and a passive component 425, which are electrically connected to a first printed circuit board 10, may be included. The third semiconductor chip 421 may include a 5G base band integrated circuit, and the fourth semiconductor chip 422 may include an intermediate frequency integrated circuit.

The descriptions of the other elements may be the same as the descriptions of the elements of the printed circuit board assemblies described in the aforementioned example embodiments, and thus, detailed descriptions thereof will not be repeated.

Figure 21:
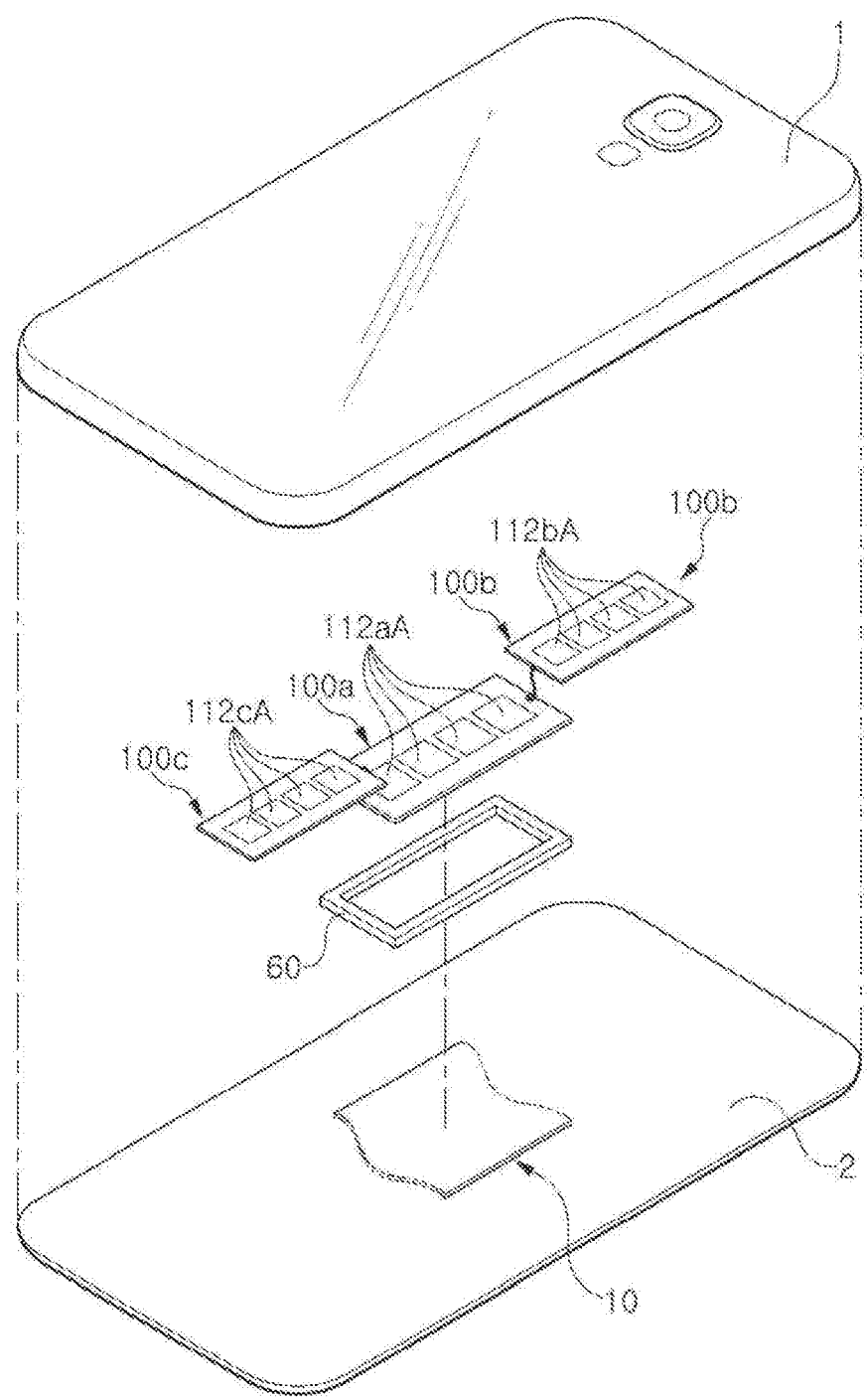
FIG. 21 is a schematic perspective diagram illustrating a printed circuit board assembly illustrated in FIG. 22.
Figure 22:
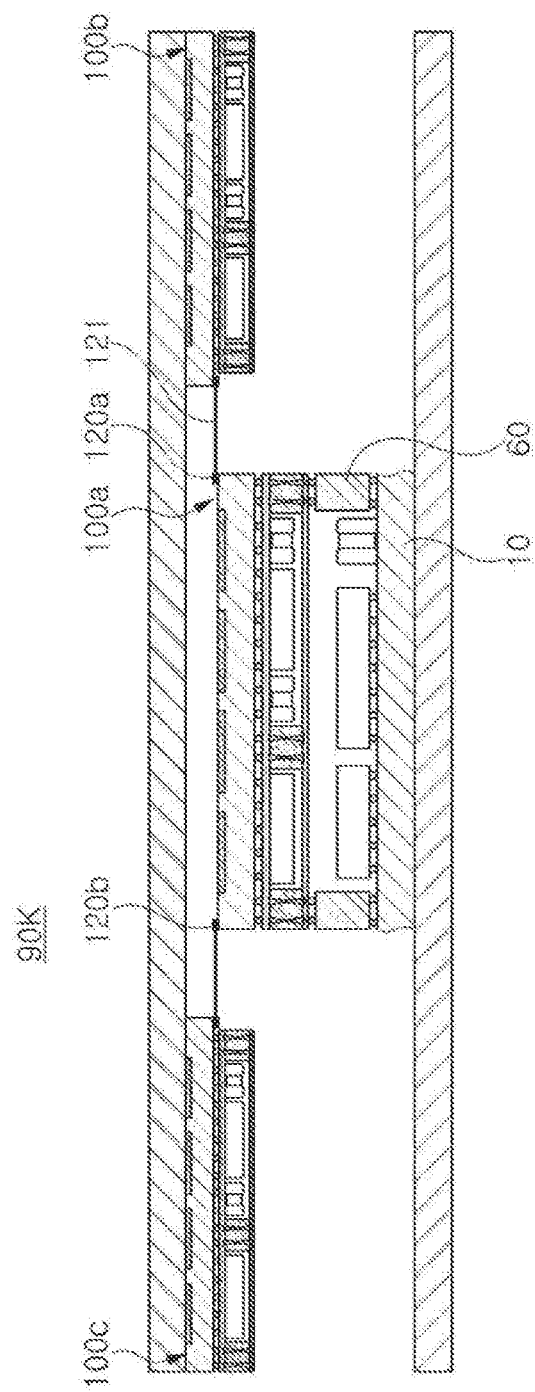
FIGS. 22 and 23 are schematic cross-sectional diagrams illustrating a portion of a printed circuit board assembly according to another example embodiment.

FIG. 20 is a perspective diagram illustrating portions of printed circuit board assemblies 90K and 90L illustrated in FIGS. 21 and 22.

Referring to FIG. 20, a second antenna substrate 100b and a third antenna substrate 100c spaced apart from a first antenna substrate 100a including a first antenna pattern 112aA, and including a second antenna pattern 112bA and a third antenna pattern 112cA, respectively. For example, a first printed circuit board 10, the first antenna substrate 100a disposed on one side of the first printed circuit board 10 and including a first antenna pattern, one or more first electronic components (not illustrated) disposed between the first printed circuit board 10 and the first antenna substrate 100a and electrically connected to at least one of the first printed circuit board 10 and the first antenna substrate 100a, a first interposer substrate disposed around the one or more first electronic components and electrically connecting the first printed circuit board 10 and the first antenna substrate 100a, a second antenna substrate 100b spaced apart from the first antenna substrate 100a and including a second antenna pattern 112bA, and a third antenna substrate 100c spaced apart from the first antenna substrate 100a and including a third antenna pattern 112cA may be further included. The second antenna substrate 100b and the third antenna substrate 100c may be electrically connected to the first antenna substrate 100a through a first connector and a second connector (see 120a and 120b in FIGS. 21 and 22) disposed on at least one of an upper surface and a lower surface of the first antenna substrate 100a, respectively.

The second antenna substrate 100b and the third antenna substrate 100c may be mounted on cases 1 and 2 of an electronic device, and may be electrically connected to the first antenna substrate 100a using a coaxial cable, a flexible printed circuit board (FPCB), and the like. Thus, positions of the second antenna substrate 100b and the third antenna substrate 100c may not be limited to any particular positions, and the second antenna substrate 100b and the third antenna substrate 100c may be spaced apart from the first printed circuit board 10 on which the first antenna substrate 100a is mounted.

The second printed circuit board 20 in the printed circuit board assemblies 90A to 90J described in the one or more example embodiments may correspond to the first antenna substrate 100a, and may further include the second antenna substrate 100b and the third antenna substrate 100c. Thus, the first antenna substrate 100a surface-mounted (SMT) on the first printed circuit board 10 by means of the first interposer substrate 60, and the second antenna substrate 100b and the third antenna substrate 100c spaced apart from the first printed circuit board 10 and electrically connected to the first antenna substrate 100a through a coaxial cable may be applied to the printed circuit board assemblies 90A to 90J described in the aforementioned example embodiments, and the detailed description thereof will be the same as in the example embodiment described with reference to FIG. 20.

FIG. 22 is a cross-sectional diagram illustrating a portion of a printed circuit board assembly 90K according to another example embodiment.

Referring to FIG. 22, a first connector 120a and a second connector 120b disposed on an upper surface of a first antenna substrate 100a and electrically connected to the first antenna substrate 100a may be further included, and a second antenna substrate 100b and a third antenna substrate 100c may be electrically connected to the first connector 120a and the second connector 120b through a coaxial cable 121, a flexible printed circuit board (FPCB) 121, or the like, respectively.

By connecting the second antenna substrate 100b and the third antenna substrate 100c to the first antenna substrate 100a through a cable 121, flexibility of placement for the second antenna substrate 100b and the third antenna substrate 100c may be improved. Also, by disposing the connectors 120a and 120b on an upper surface of the first antenna substrate 100a, a horizontal area of the first antenna substrate 100a may be significantly reduced.

Each of the connectors 120a and 120b may be connected to a coaxial cable 121, a flexible printed circuit board (FPCB) 121, or the like, and may provide a physical and/or electrical connection path with the other elements in the printed circuit board assembly. A material and shape of the connector may not be limited to any particular example, and may be implemented as a well-known material and shape.

The descriptions of the other elements may be the same as the descriptions of the elements of the printed circuit board assemblies described in the aforementioned example embodiments, and thus, detailed descriptions thereof will not be repeated.

Figure 23:
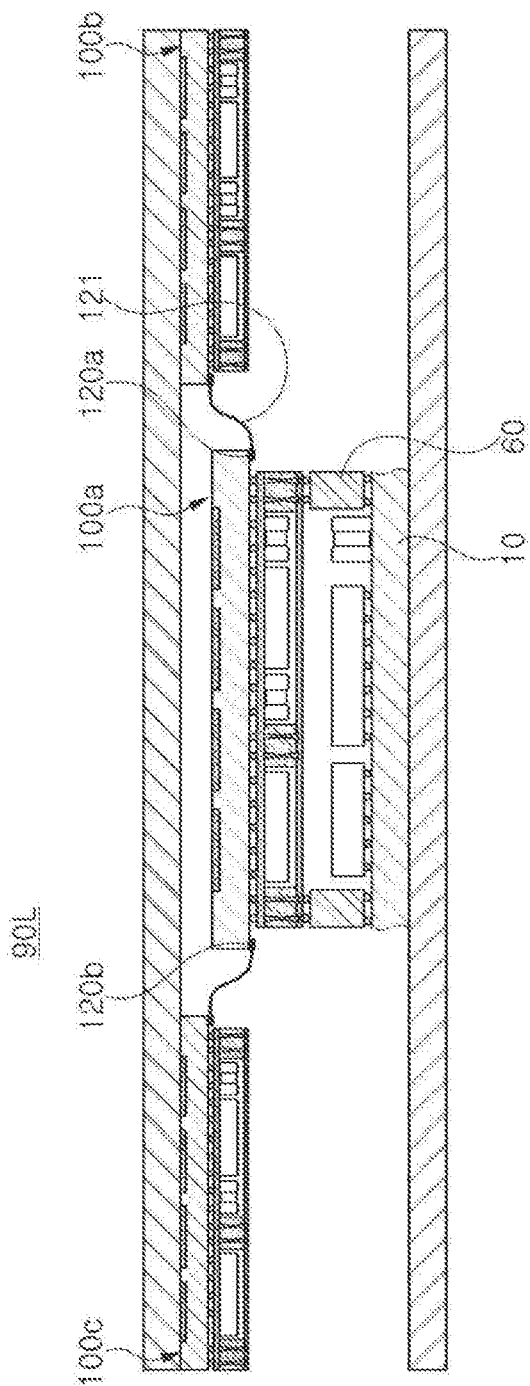

FIG. 23 is a cross-sectional diagram illustrating a portion of a printed circuit board assembly 90L according to another example embodiment.

Referring to FIG. 23, a first connector 120a and a second connector 120b disposed on a lower surface of a first antenna substrate 100a and electrically connected to the first antenna substrate 100a may be included, and a second antenna substrate 100b and a third antenna substrate 100c may be electrically connected to the first connector 120a and the second connector 120b through a coaxial cable 121, a flexible printed circuit board (FPCB) 121, or the like, respectively. When the connectors 120a and 120b are disposed on a lower surface of the first antenna substrate 100a, a signal path with the first printed circuit board 10, a main substrate, may be reduced, and a remaining area of the first antenna substrate 100a may be used for another purpose.

The descriptions of the other elements may be the same as the descriptions of the elements of the printed circuit board assemblies described in the aforementioned example embodiments, and thus, detailed descriptions thereof will not be repeated.

According to the aforementioned example embodiments, a printed circuit board assembly having improved integration density of electronic components, and having improved heat dissipation, electromagnetic interference (EMI) shielding properties, and the like, may be provided.

In the example embodiments, "lower side," "lower portion," "lower surface," and the like, may refer to a direction towards a mounting surface of a fan-out semiconductor package with reference to the cross-sectional surfaces illustrated in the diagrams, and "upper side," "upper portion," "upper surface," and the like, may refer to the opposite direction. The directions may be defined as above for ease of description, and the scope or right of claims will not be limited thereto.

In the example embodiments, when an element is mentioned as being "connected" to another component, this may mean that the element is directly connected to another component, and may also mean that the element is indirectly connected to another component with an intervening element therebetween. While terms such as "first" and "second," etc., may be used to describe various components, such components must not be understood as being limited to the above terms. The above terms are used only to distinguish one component from another. For example, a first component may be referred to as a second component without departing from the scope of rights of the present invention, and likewise a second component may be referred to as a first component.

It is to be understood that the various example embodiments of the invention, although different, are not necessarily mutually exclusive. For example, structures, shapes, and sizes described as examples in embodiments in the present disclosure may be implemented in another example embodiment without departing from the spirit and scope of the present disclosure. Further, modifications of positions or arrangements of elements in example embodiments may be made without departing from the spirit and scope of the present disclosure.

The terms used in the following description are provided to explain a specific exemplary embodiment and are not intended to be limiting. A singular term includes a plural form unless otherwise indicated.

While the exemplary embodiments have been shown and described above, it will be apparent to those skilled in the art that modifications and variations could be made without departing from the scope of the present invention as defined by the appended claims.

What is claimed is:

1. A printed circuit board assembly, comprising:
a first printed circuit board having a first surface and a second surface opposing the first surface;
a second printed circuit board disposed on the first surface of the first printed circuit board and including an antenna pattern disposed on a first surface of the second printed circuit board;
a first electronic component disposed on a second surface of the second printed circuit board opposing the first surface of the second printed circuit board;
a second electronic component disposed on the first surface of the first printed circuit board;
a first interposer substrate disposed around the first and second electronic components and electrically connecting the first printed circuit board and the second printed circuit board to each other;
a third printed circuit board disposed on the first surface of the first printed circuit board and spaced apart from the second printer circuit board;
a third electronic component disposed on a surface of the third printed circuit board;
a fourth electronic component disposed on the first surface of the first printed circuit board; and
a second interposer substrate disposed around the third and fourth electronic components and electrically connecting the first printed circuit board and the third printed circuit board to each other,
wherein the first printed circuit board, the second electronic component, the first electronic component, and the second printed circuit board are sequentially disposed, and
wherein the first printed circuit board, the fourth electronic component, the third electronic component and the third printed circuit board are sequentially disposed.

2. The printed circuit board assembly of claim 1, further comprising:
a fifth electronic component disposed on one of the second surface of the first printed circuit board or a surface of the third printed circuit board opposing the surface thereof on which the third electronic component is disposed; and
a metal layer covering the fifth electronic component.

3. The printed circuit board assembly of claim 1, further comprising:
a metal layer disposed between the first and second electronic components.

4. The printed circuit board assembly of claim 1, further comprising:
an interconnect structure, on which the first electronic component is disposed, disposed on the second surface of the second printed circuit board,
wherein the first electronic component is electrically connected to the first printed circuit board through a redistribution layer of the interconnect structure and the first interposer substrate.

5. The printed circuit board assembly of claim 1, wherein the first surface of the second printed circuit board is devoid of any semiconductor device or die.

6. The printed circuit board assembly of claim 1, wherein the second printed circuit board includes a recess in which the antenna pattern is disposed.

7. A printed circuit board assembly, comprising:
a first printed circuit board having a first surface and a second surface opposing the first surface;
a second printed circuit board disposed on the first surface of the first printed circuit board and including an antenna pattern;

a first electronic component disposed on a surface of the second printed circuit board opposing the antenna pattern;

a second electronic component disposed on the first surface of the first printed circuit board;

a first interposer substrate disposed around the first and second electronic components and electrically connecting the first printed circuit board and the second printed circuit board to each other;

a third printed circuit board disposed on the first surface of the first printed circuit board and spaced apart from the second printed circuit board;

a third electronic component disposed on a surface of the third printed circuit board;

a fourth electronic component disposed on the first surface of the first printed circuit board; and a second interposer substrate disposed around the third and fourth electronic components and electrically connecting the first printed circuit board and the third printed circuit board to each other, wherein the first printed circuit board, the second electronic component, the first electronic component, and the second printed circuit board are sequentially disposed, and wherein the first printed circuit board, the fourth electronic component, the third electronic component, and the third printed circuit board are sequentially disposed.

8. The printed circuit board assembly of claim 7, further comprising:

a fifth electronic component disposed on one of the second surface of the first printed circuit board or a surface of the third printed circuit board opposing the surface thereof on which the third electronic component is disposed; and a metal layer covering the fifth electronic component.

9. The printed circuit board assembly of claim 7, further comprising:

a metal layer disposed between the first and second electronic components.

10. The printed circuit board assembly of claim 7, further comprising:

an interconnect structure, on which the first electronic components is disposed, disposed on the surface of the second printed circuit board opposing the antenna pattern, wherein the first electronic component is electrically connected to the first printed circuit board through a redistribution layer of the interconnect structure and the first interposer substrate.

* * * * *